(12) United States Patent
Hawkins et al.

(10) Patent No.: US 10,540,750 B2
(45) Date of Patent: Jan. 21, 2020

(54) ELECTRONIC DEVICE WITH AN UPSCALING PROCESSOR AND ASSOCIATED METHOD

(71) Applicants: STMicroelectronics SA, Montrouge (FR); STMicroelectronics (Research & Development) Limited, Marlow (GB)

(72) Inventors: Ed Hawkins, Edinburgh (GB); Arnaud Bourge, Paris (FR); Chandan Siyag, Edinburgh (GB)

(73) Assignees: STMICROELECTRONICS SA, Montrouge (FR); STMICROELECTRONICS (RESEARCH & DEVELOPMENT) LIMITED, Marlow (GB)

( * ) Notice: Subject to any disclaimer, the term of this patent is extended or adjusted under 35 U.S.C. 154(b) by 0 days.

(21) Appl. No.: 15/976,677

(22) Filed: May 10, 2018

(65) Prior Publication Data

US 2018/0268522 A1    Sep. 20, 2018

Related U.S. Application Data

(63) Continuation-in-part of application No. 15/204,185, filed on Jul. 7, 2016, now Pat. No. 10,075,702.

(51) Int. Cl.
*G06T 3/40* (2006.01)
*H01L 31/02* (2006.01)
*G06T 7/50* (2017.01)

(52) U.S. Cl.
CPC .............. *G06T 3/4053* (2013.01); *G06T 7/50* (2017.01); *H01L 31/02027* (2013.01)

(58) Field of Classification Search
CPC .... G06T 3/4053; G06T 7/50; H01L 31/02027

USPC ............................................. 382/299; 348/77
See application file for complete search history.

(56) References Cited

U.S. PATENT DOCUMENTS

| 8,964,067 | B2 | 2/2015 | Conley | |
|---|---|---|---|---|
| 2010/0007804 | A1* | 1/2010 | Guncer | G09G 3/3426 348/790 |
| 2011/0246889 | A1* | 10/2011 | Moore | G06Q 10/04 715/719 |
| 2011/0285826 | A1* | 11/2011 | Bickerstaff | H04N 13/239 348/47 |

(Continued)

OTHER PUBLICATIONS

Perenzoni et al, Depth-Range extension with folding technique for SPAD-Based TOF LIDAR system (Year: 2014).*

*Primary Examiner* — Shan E Elahi
(74) *Attorney, Agent, or Firm* — Slater Matsil, LLP

(57) ABSTRACT

An electronic device includes a SPAD array and readout circuitry coupled thereto. The readout circuitry generates a depth map having a first resolution, and a signal count map having a second resolution greater than the first resolution. The depth map corresponds to distance observations to an object. The signal count map corresponds to intensity observation sets of the object, with each intensity observation set including intensity observations corresponding to a respective distance observation in the depth map. An upscaling processor is coupled to the readout circuitry to calculate upscaling factors for each intensity observation set so that each distance observation has respective upscaling factors associated therewith. The depth map is then upscaled from the first resolution to the second resolution based on the respective upscaling factors.

20 Claims, 15 Drawing Sheets

(56) References Cited

U.S. PATENT DOCUMENTS

| | | | |
|---|---|---|---|
| 2012/0195492 A1 | 8/2012 | Ali et al. | |
| 2012/0328212 A1* | 12/2012 | Lee | G06T 3/4053 |
| | | | 382/299 |
| 2013/0064448 A1* | 3/2013 | Tomaselli | G06T 5/002 |
| | | | 382/167 |
| 2014/0067631 A1* | 3/2014 | Dhuse | G06Q 40/10 |
| | | | 705/30 |
| 2014/0086325 A1* | 3/2014 | Chen | H04N 19/52 |
| | | | 375/240.14 |
| 2014/0168424 A1* | 6/2014 | Attar | G01C 3/10 |
| | | | 348/140 |
| 2014/0328546 A1 | 11/2014 | Kourousias et al. | |
| 2015/0036014 A1 | 2/2015 | Lelescu et al. | |
| 2015/0120241 A1* | 4/2015 | Kadambi | G01S 17/89 |
| | | | 702/166 |
| 2015/0285625 A1* | 10/2015 | Deane | G01S 17/10 |
| | | | 348/140 |
| 2016/0248984 A1* | 8/2016 | Li | H04N 5/23296 |
| 2017/0052065 A1 | 2/2017 | Sharma et al. | |
| 2017/0131089 A1 | 5/2017 | Bronstein et al. | |
| 2017/0176579 A1* | 6/2017 | Niclass | G01S 7/4863 |
| 2017/0179173 A1* | 6/2017 | Mandai | H01L 27/14609 |
| 2017/0184704 A1* | 6/2017 | Yang | G01S 7/4816 |
| 2018/0302611 A1* | 10/2018 | Baak | H04N 13/257 |

\* cited by examiner

ELECTRONIC DEVICE WITH AN UPSCALING PROCESSOR AND ASSOCIATED METHOD

PRIORITY CLAIM AND CROSS-REFERENCE

This application is a continuation-in-part of U.S. patent application Ser. No. 15/204,185, filed on Jul. 7, 2016, and entitled "Electronic Device with an Upscaling Processor and Associated Methods," which application is incorporated herein by reference.

FIELD OF THE INVENTION

The present invention relates to the field of electronic devices, and more particularly, to an electronic device with an upscaling processor for upscaling a depth map and related methods.

BACKGROUND

A number of applications require fast and precise depth map evaluations. These applications include, for example, gesture recognition systems, face recognition systems, virtual keyboards, object and person monitoring, and virtual reality games.

Time-of-flight (ToF) depth sensors have become more widespread over the past years. At the high end side, some devices like the Kinect2 device from Microsoft provide a high definition depth map up to 1080p (HD). At the low end side, other ToF devices provide a low resolution depth map with just one or a few ranging points. In some cases, information related to the reflected intensity, referred to as "signal count," is also output at a higher resolution.

Even though high resolution depth devices are available, a disadvantage is cost. In sharp contrast, the low resolution devices are typically one or several order of magnitude less expensive. However, a low resolution depth map needs to be increased, such as through upsampling.

One approach to increase the number of simultaneous ranging points of a low resolution depth map is to use spatial upsampling. These methods include bilinear, weighted average, median and bicubic, for example. However, these methods have several shortcomings.

One shortcoming is that the upsampling does not add real information. Straightforward algorithms typically result in blurry images or edge artifacts. More complex algorithms require not only more operations but also larger kernels, which may not be suited to a very low resolution depth map. More generally, border pixels are problematic or neglected in these image processing methods while their proportion may be large with a very low input resolution.

Another approach to increase the number of simultaneous ranging points of a low resolution depth map is to use super resolution from multiple acquisitions. Super resolution sums up the different information acquired at different instants. Similarly, simultaneous acquisitions from different viewpoints can be used as inputs. However, super resolution is not generic since it relies on motion between acquisitions and needs aliased inputs, or relies on the availability of several synchronized devices in the case of simultaneous acquisitions, which is then more costly. An IEEE Transactions on Image Processing article titled "Fast and Robust Multiframe Super Resolution" is computationally heavy and iterative. Even more difficult is the case for a 3×3 depth map due to the very limited input resolution, where a global motion vector would need to be estimated from two successive 3×3 inputs.

Yet another approach to increase the number of simultaneous ranging points of a low resolution depth map is to use joint bilateral upsampling. Joint bilateral upsampling makes use of two different signals available at two different resolutions. In the case of a ToF device, these would be the signal count map in parallel with the depth map, with the signal count map having a higher resolution than the depth map. Joint bilateral upsampling works better than traditional spatial upsampling by following edges from the signal count map, and is more generic and less complex than super resolution. However, joint bilateral upsampling is blind on the nature of its input data and thus does not take advantage of known properties from the device, and is a heuristic approach that needs tuning. In addition, joint bilateral upsampling remains sensitive to the fact that most input values for a 3×3 depth map are border pixels.

Even in view of the above described approaches, there is still a need to improve upsampling of a low resolution depth map.

SUMMARY

One aspect is directed to an electronic device comprising a single-photon avalanche diode (SPAD) array and readout circuitry coupled. The readout circuitry may be configured to generate a depth map having a first resolution, and a signal count map having a second resolution greater than the first resolution. The depth map may correspond to a plurality of distance observations to an object. The signal count map may correspond to a plurality of intensity observation sets of the object, with each intensity observation set comprising a plurality of intensity observations corresponding to a respective distance observation in the depth map.

The electronic device may further include an upscaling processor coupled to the readout circuitry. The upscaling processor may be configured to calculate a plurality of upscaling factors for each intensity observation set so that each distance observation has a respective plurality of upscaling factors associated therewith. The depth map may then be upscaled from the first resolution to the second resolution based on the respective plurality of upscaling factors.

The upscaling factor may be a shaping function that is advantageously based on physical properties between the intensity observations in the signal count map and the distance observations in the depth map. Each intensity observation may be proportional to an inverse of a corresponding distance observation squared. The plurality of upscaling factors advantageously upscale a single distance observation in the depth map to a plurality of distance observations.

The SPAD array and readout circuitry may simultaneously generate the depth map and the signal count map. The upscaling may be performed in real-time and on-the-fly without requiring calibration.

The electronic device may further comprise an infrared light source for illuminating the object.

The upscaling processor may be configured to calculate the plurality of upscaling factors for each intensity observation set based on an average intensity observation value of the intensity observation set and on individual intensity observation values within the intensity observation set. More particularly, the plurality of upscaling factors may be based on the following equation:

$$f(\overline{SigCnt_i}, SigCnt_{i,j}) = \sqrt{\frac{SigCnt_i}{SigCnt_{i,j}}}$$

where $\overline{SigCnt_i}$, is an average intensity observation value derived from the respective intensity observation set;

where $SigCnt_{i,j}$ is the individual intensity observation values within the respective intensity observation set;

where i varies from 1 to M and corresponds to the number of distance observations to the object; and where j varies from 1 to N and corresponds to the number of individual intensity observation values within the intensity observation set encompassing the observed distance i.

Another aspect is directed to a method for operating the electronic device as described above. The method may comprise operating the SPAD array and readout circuitry to generate the depth map having a first resolution, and a signal count map having a second resolution greater than the first resolution. The depth map may correspond to a plurality of distance observations to an object. The signal count map may correspond to a plurality of intensity observation sets of the object, with each intensity observation set comprising a plurality of intensity observations corresponding to a respective distance observation in the depth map. The method may further comprise operating an upscaling processor to calculate a plurality of upscaling factors for each intensity observation set so that each distance observation has a respective plurality of upscaling factors associated therewith. The depth map may then be upscaled from the first resolution to the second resolution based on the respective plurality of upscaling factors.

DETAILED DESCRIPTION

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
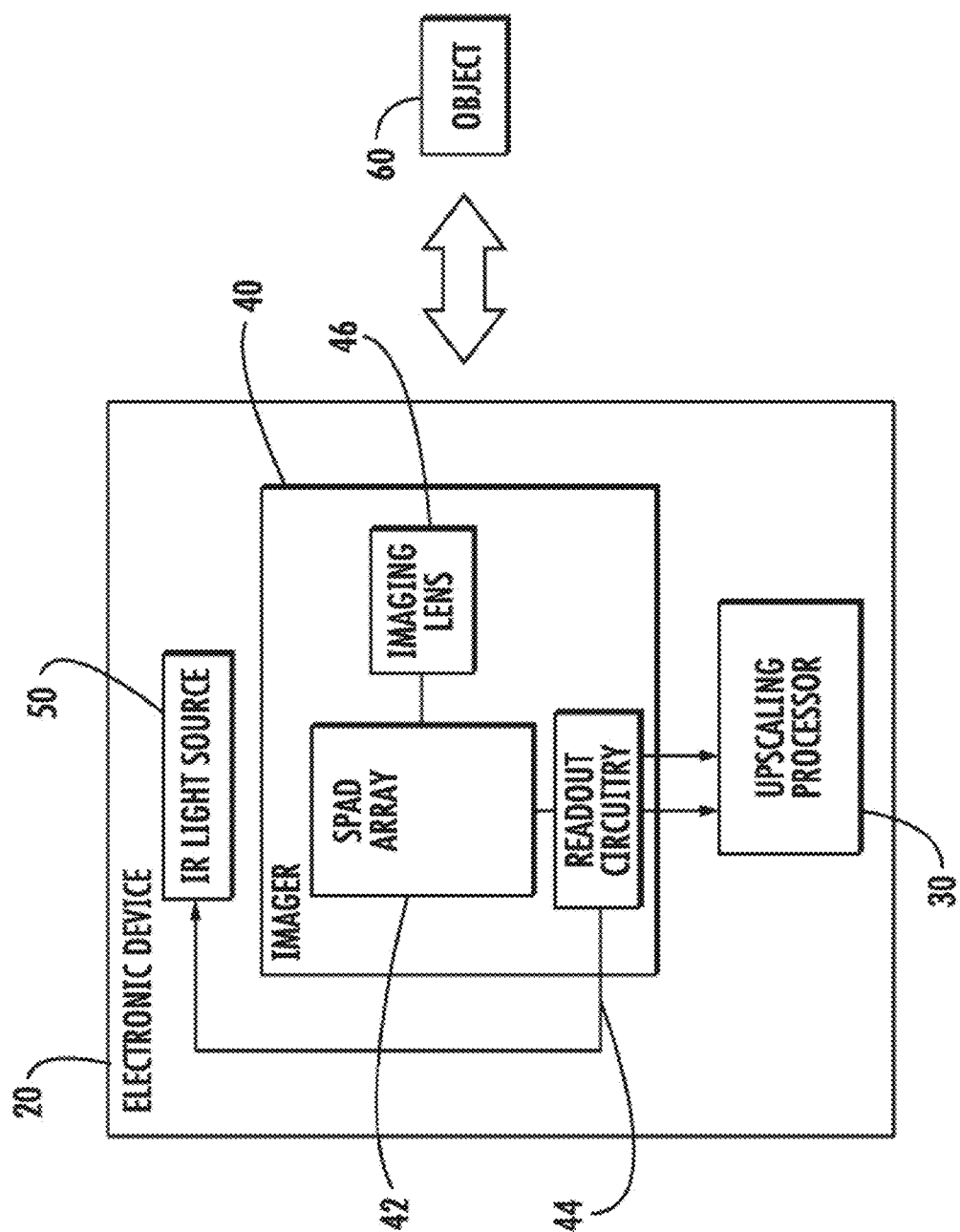
FIG. 1 is a block diagram of an electronic device with an upscaling processor for upscaling a depth map in accordance with an embodiment of the present invention.

An electronic device 20 with an upscaling processor 30 will be discussed in reference to FIG. 1. The upscaling processor 30 advantageously upscales a low resolution depth map of an object 60 to a higher resolution based on physical properties between intensity values in a signal count map of the object and distance observations in the depth map.

The electronic device 20 includes a SPAD array 42 and readout circuitry 44 coupled thereto. The readout circuitry 44 is configured to generate the depth map and the signal count map. The depth map has a first resolution, and corresponds to a plurality of distance observations to the object 60. The signal count map has a second resolution greater than the first resolution, and corresponds to a plurality of intensity observation sets of the object 60. Each intensity observation set comprises a plurality of intensity observations corresponding to a respective distance observation in the depth map.

The upscaling processor 30 is coupled to the readout circuitry 44 and is configured to calculate a plurality of upscaling factors for each intensity observation set so that each distance observation has a respective plurality of respective upscaling factors associated therewith. The depth map is then upscaled from the first resolution to the second resolution based on the respective plurality of upscaling factors.

The electronic device 20 further includes an imaging lens 46 coupled to the SPAD array 42, and an infrared light source 50 is used to illuminate the object 60 with optical pulses. The object 60 is hit by uncollimated light that is pulsed at a given repetition rate, as readily appreciated by those skilled in the art. The SPAD array 42, the readout circuitry 44 and the imaging lens 46 form an imager 40.

The electronic device 20 may also be referred to as a photonics device, and may be used for a number of applications that require fast and precise depth map evaluations. These applications include, for example, gesture recognition systems, face recognition systems, virtual keyboards, object and person monitoring, and virtual reality games.

Figure 2:
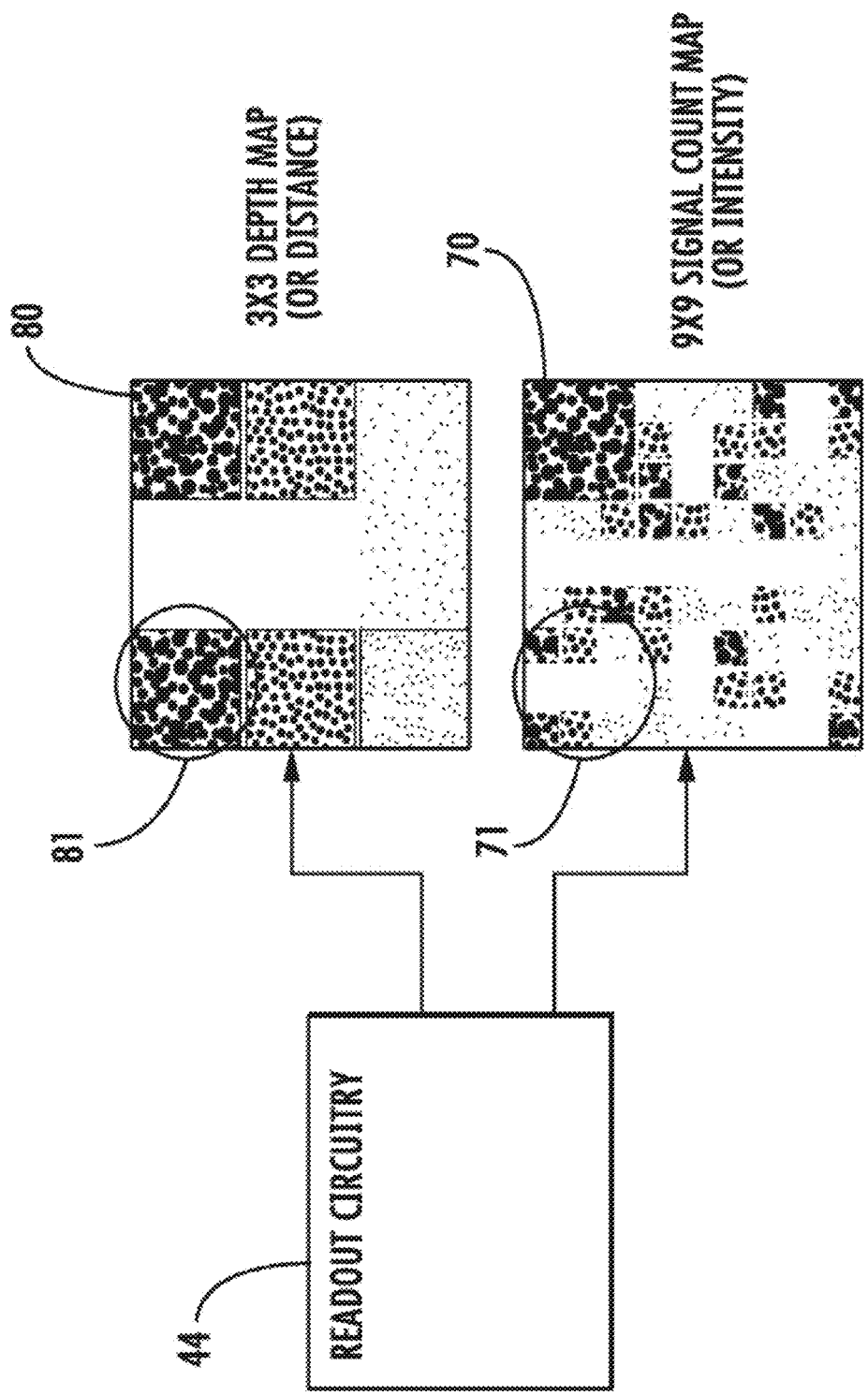
FIG. 2 is a block diagram of the readout circuitry illustrated in FIG. 1 outputting the depth map and the signal count map, in some embodiments.

Referring now to FIG. 2, the readout circuitry 44 outputs the signal count map 70, and outputs the depth map 80. The depth map 80 and the signal count map 70 are available simultaneously, and are co-located. As will now be discussed in greater detail, the respective plurality of upscaling factors as calculated by the upscaling processor 30 is a shaping function that is advantageously based on physical properties between the intensity observations in the signal count map 70 and the distance observations in the depth map 80.

The readout circuitry 47 may include asynchronous digital counters, for example, for counting the number of pulses produced by the associated SPAD zones within the SPAD array 42 during a predetermined period of time after emission of optical pulses by the infrared light source 50. The output of the counters corresponds to the number of photons reflected by the corresponding portions of the object, and thus indicates a brightness of the object 60.

The readout circuitry 49 may also includes time-to-digital converters, for example, to determine distances to the object 60 by determining the elapsed times between the emissions of each pulse and reception of the corresponding reflected photons. The digital values determined by each time-to-digital converter indicates the time of flight of the photons, and are used for determining the distances between the associated SPAD zones within the SPAD array 42 and the corresponding portions of the object 60.

For illustration purposes, the resolution of the depth map 80 is 3×3, and the resolution of the signal count map 70 is 9×9. Depending on the intended applications, the signal count and depth maps 70, 80 may be other resolutions, as readily appreciated by those skilled in the art. Application of the respective plurality of upscaling factors as calculated by the upscaling processor 30 is not limited to any particular resolution.

For a depth map 80 with a 3×3 resolution, there are 9 distance or ranging points, i.e., observations, to the object 60. The single or individual distance observations are represented by d(i), with i varying from 1 to 9.

For a signal count map 70 with a 9×9 resolution, there are 81 intensity observations of the object 60. Based on the correlation between the two maps, there are 9 intensity observations for each distance observation. The 9 intensity observations for each distance observation form a respective intensity observation set. For example, the nine 9 intensity observations marked by circle 71 in the signal count map 70 correspond or correlate with the distance observation marked by circle 81 in the depth map 80. This grouping pattern is repeated for the remaining intensity observations and distance observations.

The intensity observation sets are represented by SigCnt (i,j), where i varies from 1 to 9 and j also varies from 1 to 9. As noted above, i represents a particular distance observation in the depth map 80. For each particular distance observation i in the depth map 80, j represents the individual intensity observations within the signal count map 70 that correlate or correspond to that particular distance observation i. In the illustrated example, each intensity observation set has 9 intensity observations.

Figure 3:
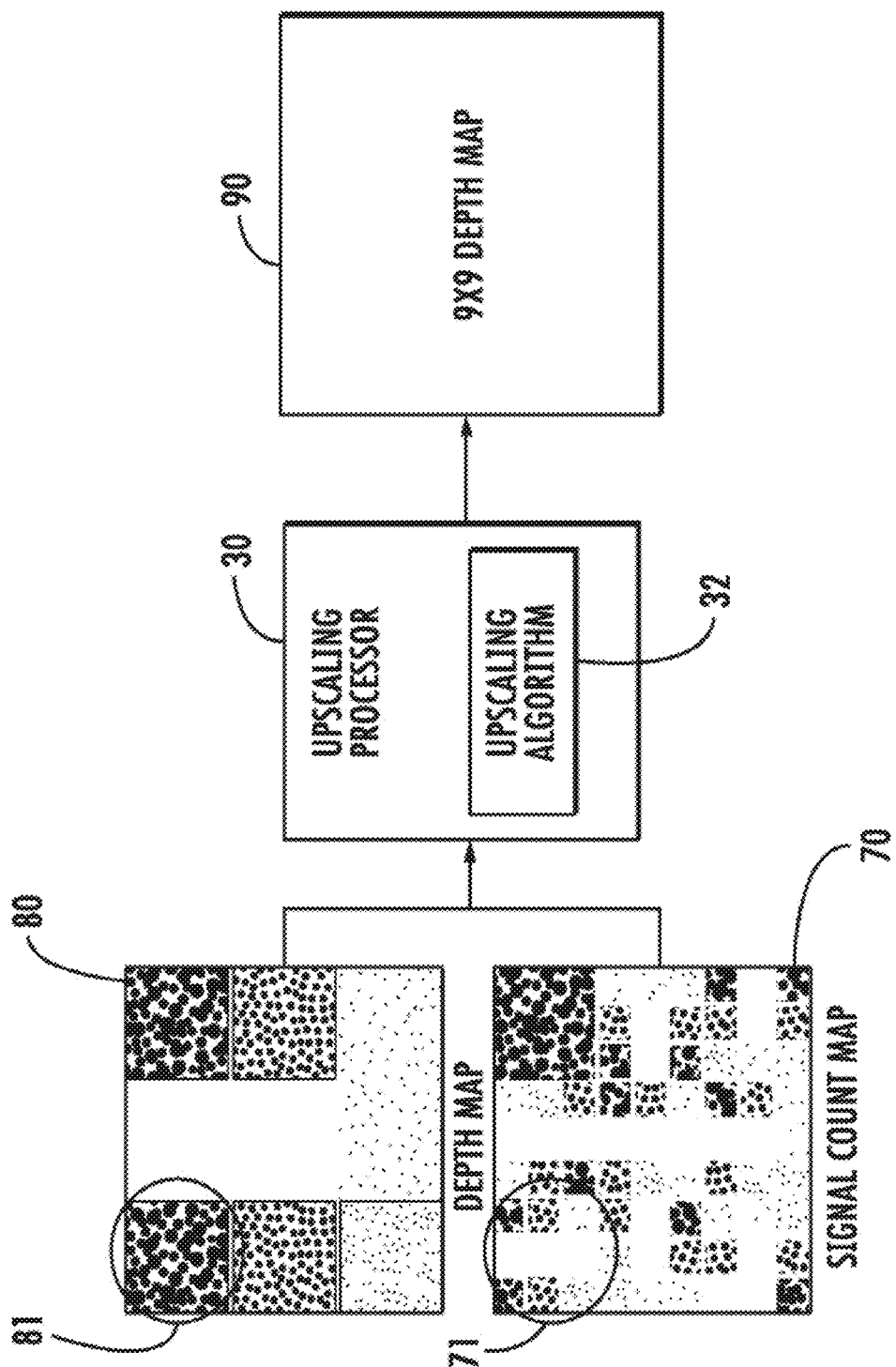
FIG. 3 is a block diagram of the upscaling processor illustrated in FIG. 1 executing an upscaling algorithm to provide the upscaled depth map, in some embodiments.

Each upscaling factor is based on the physical link between the depth map 80 and the signal count map 70. The upscaling processor 30 executes an upscaling algorithm 32 to upscale the depth map 80 with the first resolution to a depth map 90 with the second resolution, as illustrated in FIG. 3. In the illustrated example, the 3×3 depth map 80 is upscaled to a 9×9 depth map 90. The upscaling algorithm 32 is of the following form:

$\forall \text{SigCnt}_{i,j} \in \text{SPAD Array } i,$ $\widehat{d_{i,j}} = d_i \times f(\overline{\text{SigCnt}_i}, \text{SigCnt}_{i,j})$ The $\overline{\text{SigCnt}_i}$ represents averaged signal count intensity observations for each SPAD zone within the SPAD Array 42. The averaged signal count intensity observations for each SPAD zone may be calculated based on the following:

$$\sqrt{\overline{SigCnt_i}} = \frac{N}{\sum_{j=1...N} \frac{1}{\sqrt{SigCnt_{i,j}}}}$$

As illustrated above, determination of $\overline{\text{SigCnt}_i}$ is based on the use of inverse and square root functions. Alternatively, other formulas may be used to provide a "global" signal count intensity observation per zone as readily appreciated by those skilled in the art.

Unlike for a classical n-tap filter, only 1 input distance measure is used to generate N output distances. In the illustrated example, 1 distance measure is used to generate 9 output distances. The $f(\overline{\text{SigCnt}_i}, \text{SigCnt}_{i,j})$ is a local shaping function based on physical properties between local intensities and depth.

Figure 4:
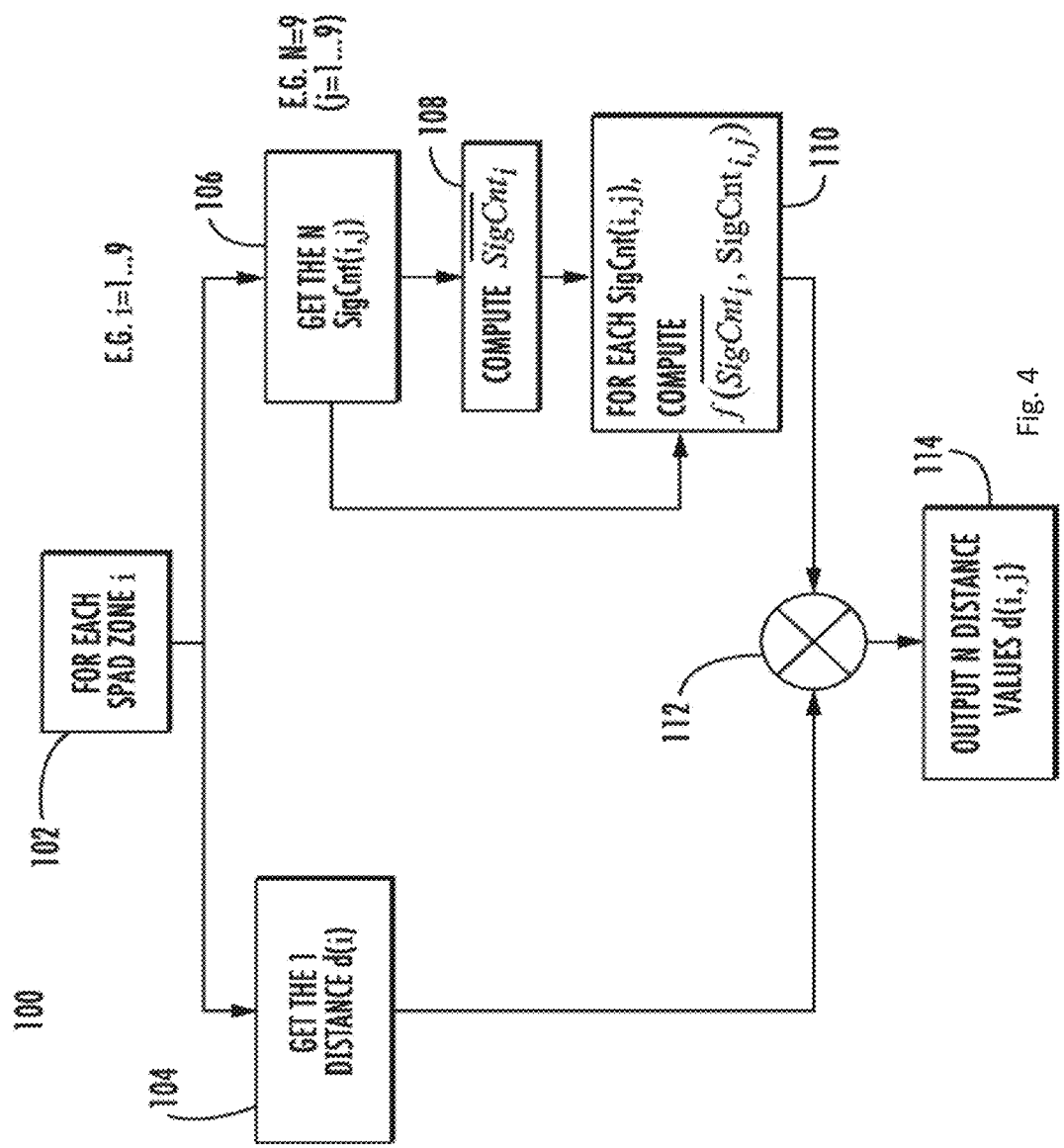
FIG. 4 is a process flow of an upscaling algorithm illustrated in FIG. 3, in some embodiments.

A process flow diagram 100 of the upscaling algorithm 32 will now be discussed in reference to FIG. 4. The process flow diagram 100 starts with Block 102, which corresponds to the different distance observations in the depth map 80, as provided by the SPAD zones within the SPAD array 42. In the illustrated example, i varies from 1 to 9 so that there are 9 SPAD zones. Each SPAD zone provides a single distance observation in the depth map 80.

For SPAD zone i=1, Block 104 provides the single distance observation corresponding to this zone. At the same time, Block 106 provides the N intensity observations in the signal count map 70 corresponding to this same SPAD zone. The N intensity observations form an intensity observation set. In the illustrated example, N=9 so that j varies from 1 to 9. The upscaling algorithm 32 computes at Block 108 an average global intensity value from the 9 intensity observation values for SPAD zone i=1. This global intensity observation value is provided to Block 110.

The plurality of upscaling factors for SPAD zone i=1 is now calculated in Block 110. In addition to receiving the global intensity observation value for SPAD zone i=1, Block 110 also receives the 9 intensity observation values corresponding to the same SPAD zone i=1. The plurality of upscaling factors, for each intensity observation set, is based on the average intensity observation value of the intensity observation set and on the individual intensity observation values within the intensity observation set.

More particularly, the plurality of upscaling factors is based on the following equation:

$$f(\overline{SigCnt_i}, SigCnt_{i,j}) = \sqrt{\frac{\overline{SigCnt_i}}{SigCnt_{i,j}}}$$

where $\overline{\text{SigCnt}_i}$ is an average intensity observation value derived from the respective intensity observation set;

where $\text{SigCnt}_{i,j}$ is the individual intensity observation values within the respective intensity observation set;

where i varies from 1 to M and corresponds to the number of distance observations to the object; and where j varies from 1 to N and corresponds to the number of individual intensity observation values within the intensity observation set encompassing the observed distance i.

The distance observation $d_1$ for SPAD zone 1 from Block 104 is provided to a multiplier 112. The plurality of upscaling factors for SPAD zone 1 from Block 110 is also provided to the multiplier 112. As noted above, the multiplication is based on the following:

$$\widehat{d_{i,j}}\, d=d_i \times f(\overline{\mathrm{SigCnt}_i}, \mathrm{SigCnt}_{i,j})$$

where $\widehat{d_{i,j}}$ is an estimate of the upscaled distance observation values. Each of the upscaling factors in the plurality of upscaling factors is multipled by the single distance observation value $d_1$. This results in the single distance observation value $d_1$ being upscaled to 9 separate values, as provided by Block 114. This process is repeated for each of the remaining SPAD zones 2-9.

The upscaling processor 30 operates in real-time within the electronic device 20. Computation of the upscaling algorithm 32 within the upscaling processor 30 may be simplified with fixed-point approximations or other optimizations (such as look up tables), or taking a straightforward formula (such as linear) if the required precision allows it.

Figure 5:
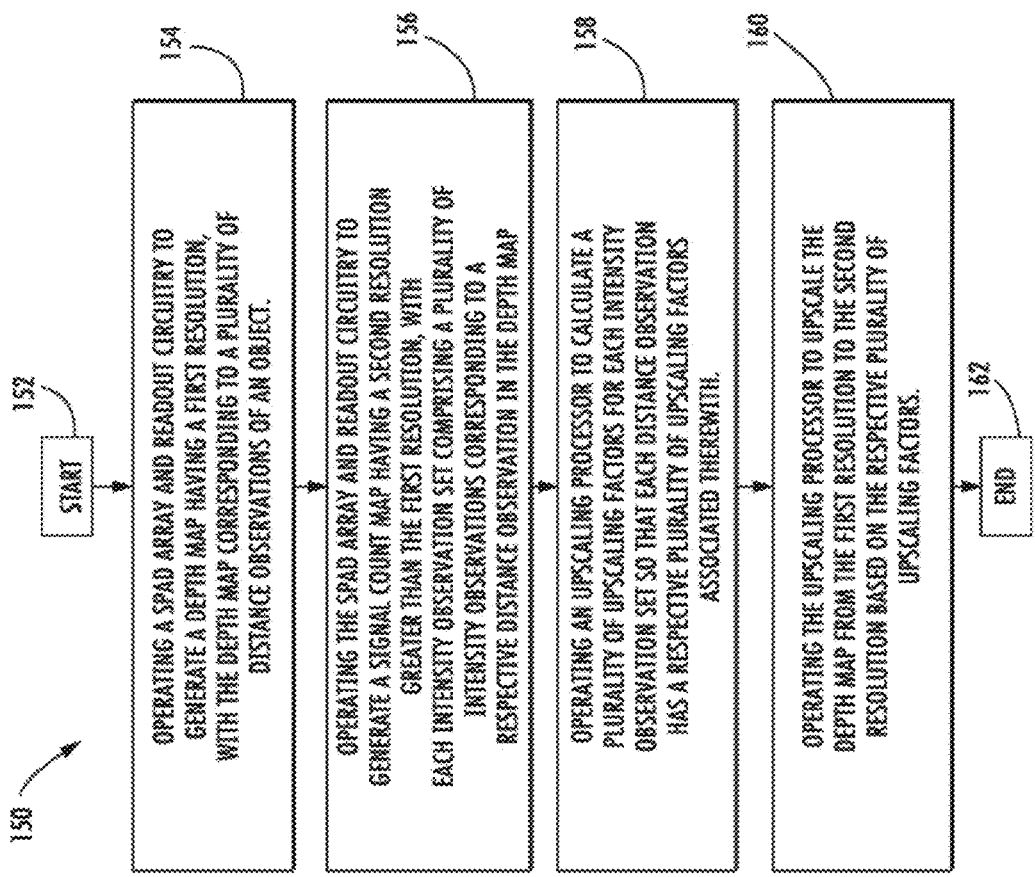
FIG. 5 is a flowchart of a method for operating the electronic device illustrated in FIG. 1 for outputting the upscaled depth map, in some embodiments.

Referring now to the flowchart 150 illustrated in FIG. 5, a method for operating the electronic device 20 as described above will be discussed. From the start (Block 152), the method comprises operating the SPAD array 42 and readout circuitry 44 to generate the depth map 80 having a first resolution at Block 154, and a signal count map 70 having a second resolution greater than the first resolution at Block 156.

The depth map 80 may correspond to a plurality of distance observations to an object 60. The signal count map 70 corresponds to a plurality of intensity observation sets of the object 60, with each intensity observation set comprising a plurality of intensity observations corresponding to a respective distance observation in the depth map 80.

The method further comprise operating an upscaling processor 30 to calculate a plurality of upscaling factors for each intensity observation set so that each distance observation has a respective plurality of upscaling factors associated therewith at Block 158. The depth map 80 is then upscaled from the first resolution to a depth map 90 with the second resolution based on the respective plurality of upscaling factors at Block 160. The method ends at Block 162.

Figure 6:
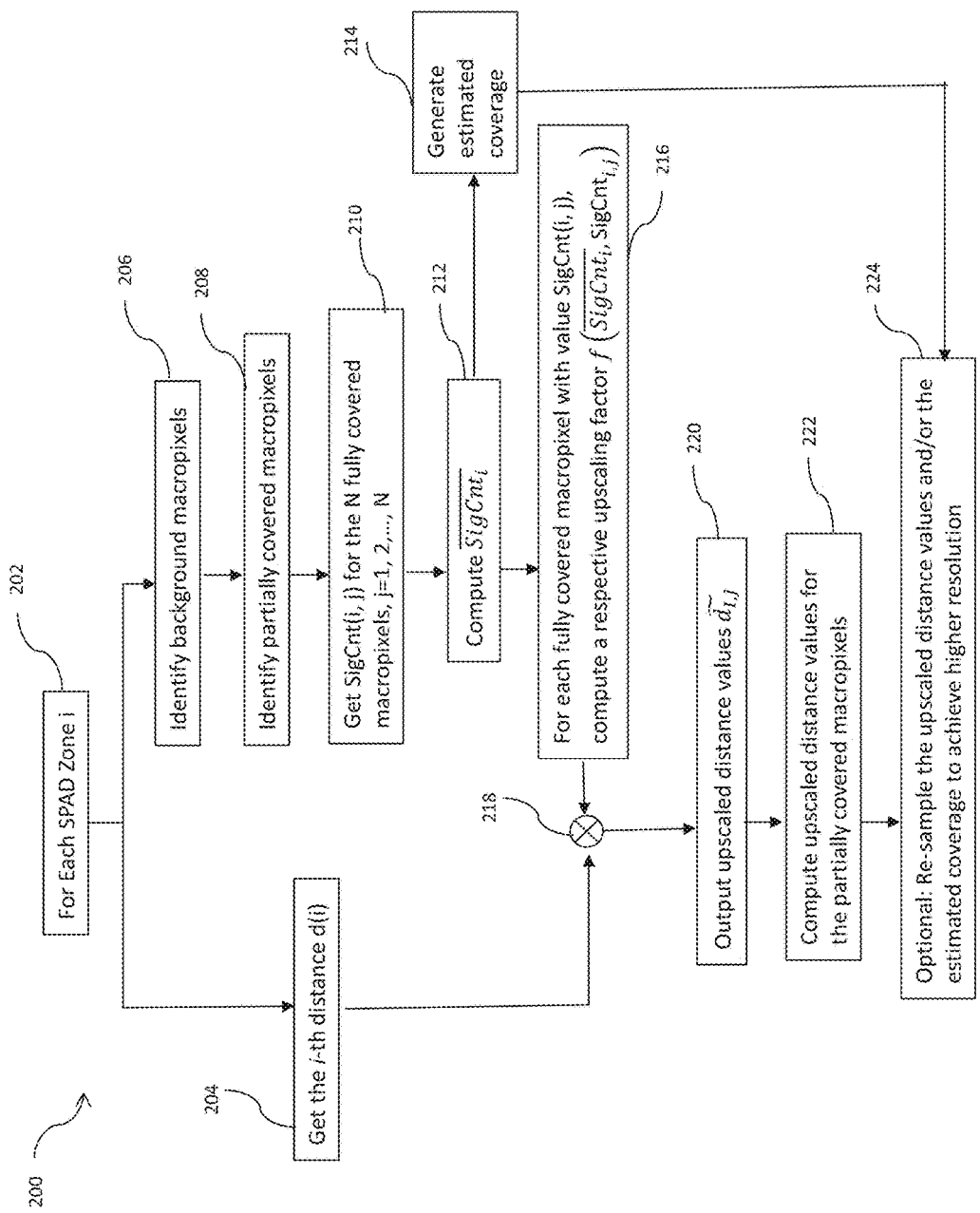
FIG. 6 illustrates a process flow of an embodiment of the upscaling algorithm illustrated in FIG. 3.

FIG. 6 is a process flow 200 of another embodiment of the upscaling algorithm illustrated in FIG. 3. The process flow 200 has similarities with the process flow 100 of FIG. 4, e.g., the processing of FIG. 6 is performed for each SPAD zone, and the distance observation d(i) corresponding to the i-th SPAD zone is multiplied with a plurality of upscaling factors to produce a plurality of upscaled distance observation values (may also be referred to as a plurality of upscaled distance values). However, unlike the process flow 100, the process flow 200 distinguishes between fully covered macropixels, partially covered macropixels, and background macropixels (details of which are discussed hereinafter), and the processing may be different for the various types of macropixels. For example, calculation of the averaged signal count intensity observation (also referred to as the average intensity observation) for each SPAD zone is calculated using only fully covered macropixels of the intensity observation set. Details of the process flow 200 are discussed hereinafter with references to FIGS. 6-13 using an example.

Note that in the discussion of the process flow 200 hereinafter, an example format for the output of the imager 40 is used, where the depth map 80 (see FIG. 2) has a resolution of 3×3 and the signal count map 70 (see FIG. 2) has a resolution of 12×12. That is, each distance observation in the depth map 80 corresponds to, or is correlated (e.g., spatially correlated) with, an intensity observation set 90S (see FIG. 7) having 16 intensity observations organized in an array of 4×4. Each intensity observation in the intensity observation set (e.g., 90S) may also be referred to as a macropixel in the discussion herein. The example format for the output of the imager 40 described here is merely an example and not limiting. The output of the imager 40 may have any other suitable format, these and other variations are fully intended to be included within the scope of the present disclosure.

Figure 7:
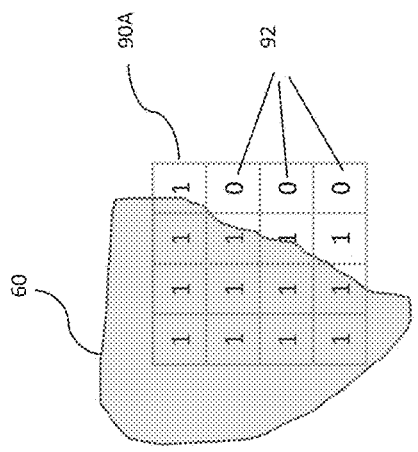
FIG. 7 illustrates an intensity observation set, in an embodiment.

Referring to FIG. 6, in Block 202, data from SPAD zone i, e.g., the i-th intensity observation set 90S and the corresponding distance observation d(i), are received for processing. The i-th intensity observation set 90S is illustrated in FIG. 7. FIG. 7 further illustrates the object 60, or a portion of the object 60, that corresponds to the SPAD zone i. The object 60 is overlaid with the i-th intensity observation set 90S to show the spatial relation between the object 60 and the i-th intensity observation set 90S. As illustrated in FIG. 7, the object 60 fully covers some macropixels on the left hand side of the i-th intensity observation set 90S, partially covers some macropixels in the middle, and uncovers (e.g., not covering) some macropixels on the right hand side of the i-th intensity observation set 90S. In the discussion below, a distance observation (or a range) of 80 mm is used for d(i). The distance observation value, the intensity observation values, and the shape/size of the object 60 used here are merely examples and not limiting, other values, shapes, dimensions are also possible and are fully intended to be included within the scope of the present disclosure. For ease of comparison between different figures, the object 60 is also illustrated in FIGS. 7-13.

In Block 206 of FIG. 6, the background macropixels in the i-th intensity observation set are identified by the upscaling processor 30. FIG. 7 shows three background macropixels 91 in the i-th intensity observation set 90S. Background macropixels are macropixels having low signal count due to, e.g., the radiation emitted by the IR light source 50 being reflected by the background of the scene (measured by the SPAD array) instead of being reflected by the object 60.

The background macropixels 91 are illustrated to have a value (e.g., signal count) of zero in the example of FIG. 7. Since the background of the scene is normally not at infinite distance and/or does not have null reflectance, and since ambient light level and photon-shot noise contribute to the noise level in the measurement of the SPAD array, the values of the background macropixels may not be zero, and may have small non-zero values.

In some embodiments, the upscaling processor 30 identifies the background macropixels 91 by comparing the values of the macropixels in the i-th intensity observation set 90S with a pre-determined threshold, and macropixels with values smaller than the pre-determined threshold are identified as background macropixels. Such an operation may also be referred as a thresholding operation. The pre-determined threshold may be determined by an estimated ambient noise level. For example, the imager 40 with the SPAD array may be characterized by, e.g., measurements, to obtain a noise profile for the imager 40. The pre-determined threshold may then be chosen in accordance with the noise profile to achieve a target detection rate for the background macropixels. As an example, assuming a Gaussian distribution for the ambient noise, the pre-determined threshold may be chosen to be, e.g., 3×SD, or 6×SD, where SD is the standard deviation of the Gaussian distribution.

In some embodiments, the upscaling processor 30 identifies the background macropixels 91 by detecting an abrupt change in the values of macropixels, since such abrupt changes may indicate a transition from a background macropixel (receiving little or no signal) to a non-background macropixel (receiving signal from the object 60). Various methods may be used to detect the abrupt change. For example, the upscaling processor 30 may compare the gradient of the values of the macropixels with a pre-determined gradient threshold, and a gradient (or an absolute value of the gradient) larger than the pre-determined gradient threshold indicate an abrupt change, thus existence of a background macropixel. The location of the detected abrupt change may be used to determine the location of the background macropixel. The gradient may be calculated as a difference between values of adjacent macropixels divided by the distance between the adjacent macropixels. For example, two immediately adjacent macropixels have a distance of 1, and two adjacent macropixels with another macropixel disposed in between have a distance of 2.

Figure 8:
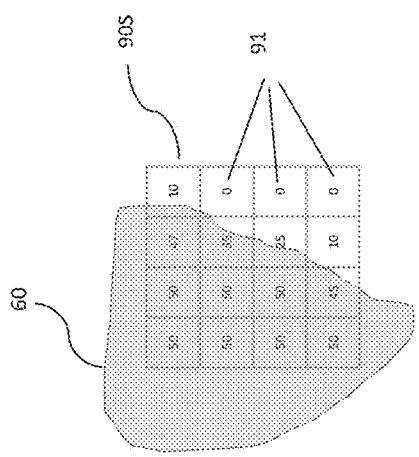
FIG. 8 illustrates a binary image of the intensity observation set of FIG. 7 after a thresholding operation, in an embodiment.

FIG. 8 illustrates a binary image 90A of the i-th intensity observation set 90S, after the background macropixels are identified. In the binary image 90A, the background macropixels (labeled as 92) are assigned a value of zero, and other macropixels (non-background macropixels) are assigned a value of one. Note that the locations of the macropixels of the binary image 90A have a one-to-one correspondence to the locations of the macropixels in the i-th intensity observation set 90S.

Next, referring to Block 208 of FIG. 6, the upscaling processor 30 identifies partially covered macropixels in the i-th intensity observation set 90S. The partially covered macropixels refer to macropixels that are adjacent to (e.g., immediately adjacent to) at least one background macropixel. In some embodiments, the upscaling processor 30 examines each macropixels having non-zero values in the binary image 90A in FIG. 8, and identifies any macropixel that neighbors (e.g., located immediately adjacent to) a background macropixel 92 (e.g., having zero value) as a partially covered macropixel (labeled as 94 in FIG. 9). Once identified, each partially covered macropixel 94 is assigned a value of zero. The above operation of assigning zero values to the partially covered macropixels is similar to an erosion operation in mathematical morphology, thus may also be referred to as an erosion operation. In alternative embodiments, the erosion operation to identify partially covered macropixels is performed first using the signal counts of the i-th intensity observation set 90S, and thereafter, the background macropixels and the fully covered macropixels are identified using, e.g., the thresholding operation.

Figure 9:
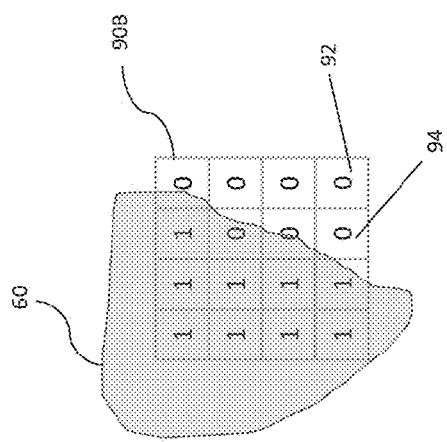
FIG. 9 illustrates an eroded binary image of the binary image of FIG. 8, in an embodiment.

After the erosion operation is completed, the binary image 90A turns into an eroded binary image 90B in FIG. 9. Note that for clarity, not all background macropixels 92 and not all partially covered macropixels 94 are labeled in FIG. 9. The macropixels in the i-th intensity observation set 90S other than the background macropixels 92 and other than the partially covered macropixels 94 are identified as fully covered macropixels. In other words, the fully covered macropixels are macropixels at locations indicated by the ones in the eroded binary image 90B. Therefore, the operation performed in the Block 206 and the block 208 may be collectively referred to as the operation to identify the fully covered macropixels.

Next, referring to Blocks 210 and 212 in FIG. 6, the upscaling processor 30 calculates an average intensity observation for the i-th intensity observation set 90S using only the values (e.g., intensity observation values) of the fully covered macropixels. In other words, only macropixels at locations corresponding to the ones in the eroded image 90B are used in calculating the average intensity observation. In particular, assume that the i-th intensity observation set 90S has N fully covered macropixels, then the average intensity observation for the i-th intensity observation set 90S, denoted by $\overline{SigCnt_i}$, is calculated by $$\sqrt{\overline{SigCnt_i}} = \frac{N}{\sum_{j=1...N} \frac{1}{\sqrt{SigCnt_{i,j}}}}$$

where $SigCnt_{i,j}$, j=1, 2, ..., N, is the value of the j-th fully covered macropixel in the i-th intensity observation set. Note that the number of fully covered macropixels N may change from one intensity observation set to another, and is determined by the processing steps shown in the Blocks 206 and 208 of FIG. 6. In addition, N is less than or equal to the total number of macropixels in the i-th intensity observation set 90S (e.g., N≤16 in this example). The index i may have a value between 1 and M, where M is the number of intensity observation sets in the signal count map 70. For the intensity observation values illustrated in FIG. 7, the average intensity observation calculated using the above equation is about 49.1.

Next, in Block 216 of FIG. 6, the upscaling processor 30 calculates an upscaling factor for each of the N fully covered macropixels by $$f(\overline{SigCnt_i}, SigCnt_{i,l}) = \sqrt{\frac{\overline{SigCnt_i}}{SigCnt_{i,l}}}$$

where l=1, 2, ..., N, $SigCnt_{i,l}$ is the value of the l-th fully covered macropixel in the i-th intensity observation set, and $f(\overline{SigCnt_i}, SigCnt_{i,l})$ is the l-th upscaling factor for the l-th fully covered macropixel.

Next, in Block 220 of FIG. 6, the distance observation d(i) for the i-th intensity observation set 90S is multiplied with the plurality of N upscaling factors $f(\overline{SigCnt_i}, SigCnt_{i,l})$ to produce a plurality of upscaled distance values $\widetilde{d_{I,J}}$, j=1, 2, ..., N, using the following equation:

$$\widetilde{d_{I,J}} = d_i \times f(\overline{SigCnt_i}, SigCnt_{i,j})$$

where each upscaled distance values $\widetilde{d_{I,J}}$ corresponds to, or is correlated (e.g., spatially correlated) with, a respective fully covered macropixel. Therefore, the upscaled distance value $\widetilde{d_{I,J}}$ is also referred to as the upscaled distance value for its respective macropixel.

Next, in Block 222 of FIG. 6, the upscaling processor 30 determines the upscaled distance values for the partially covered macropixels, details of which are discussed hereinafter. The upscaled distance values for the background macropixel may be set to an "Infinite" (Inf) value, where the Inf value may be a maximum number that can be represented by the given word length (e.g., number of bits) of the upscaled distance value, or may be a pre-determined distance value that indicates, e.g., an upper boundary of the measurable distance of the SPAD array.

Once the average intensity observation calculated using only the fully covered macropixels is available, it is possible to compute upscaling factors and upscaled distance values for the partially covered macropixels using the same equations described above for the fully covered macropixels. Although such a method may simplify the processing (since partially covered macropixels are treated the same way as the fully covered macropixels), large estimation errors (e.g., large overestimate in the upscaled distance values) for the partially covered macropixels may result. A few methods for determining the upscaled distance values for the partially covered macropixels are discussed below, which avoid or reduce the above mentioned large estimation errors.

In some embodiments, the upscaling processor 30 uses the distance observation value d(i) for the i-th intensity observation set as the upscaled distance values for the partially covered macropixels. That is, all the partially covered macropixels have the same upscaled distance value of d(i). In another embodiment, the upscaling processor 30 uses the upscaled distance value of a fully covered macropixel in the i-th intensity observation set neighboring a partially covered macropixel as the upscaled distance value for the partially covered macropixel. In another embodiment, the upscaling processor 30 calculates the upscaled distance value for a partially covered macropixel by extrapolating the upscaled distance values of neighboring macropixels (e.g., neighboring fully covered macropixels) in the i-th intensity observation set. Any suitable extrapolation method, such as bi-linear, bi-cubic extrapolation, may be used. In yet another embodiment, the upscaling processor 30 calculates the upscaled distance value for a partially covered macropixel by interpolating the upscaled distance values of neighboring macropixels. For example, the interpolation may be between the upscaled distance value of a neighboring fully covered macropixel and the upscaled distance value of a neighboring background pixel in the i-th intensity observation set. For cases where a partially covered macropixel is at the border of the i-th intensity observation set, the interpolation may be between the upscaled distance value of a neighboring fully covered macropixel of the i-th intensity observation set and the upscaled distance value of a neighboring macropixel in an adjacent k-th ($k \neq i$) intensity observation set. Bi-linear, bi-cubic, or other suitable interpolation method may be used.

Figure 10:
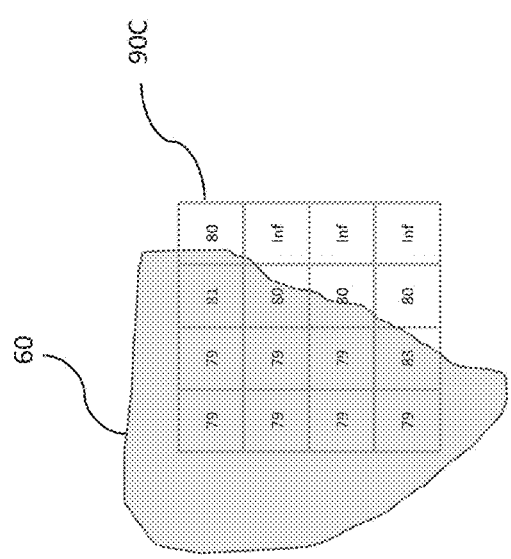
FIG. 10 illustrates upscaled distance values for the intensity observation set of FIG. 7, in an embodiment.

After the processing of the Block 222 in FIG. 6, each distance observation d(i) is upscaled to provide a plurality of upscaled distance values 90C corresponding to, and having a same dimension as, the i-th intensity observation set 90S. FIG. 10 illustrates an example of the upscaled distance values 90C.

Figure 11:
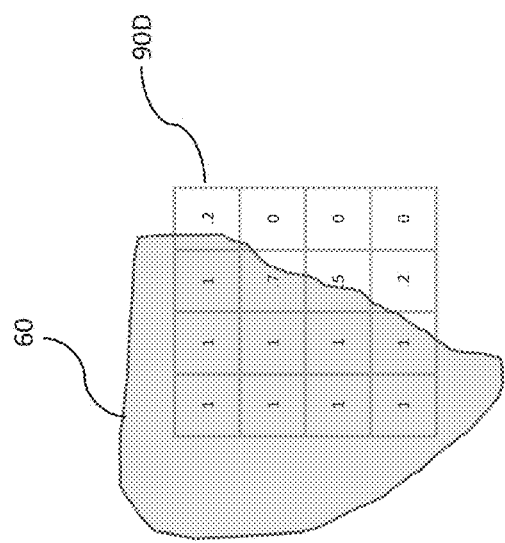
FIG. 11 illustrates an estimated coverage for the intensity observation set of FIG. 7, in an embodiment.

Still referring to FIG. 6, in Block 214, an estimated coverage for the i-th intensity observation set 90S is generated by the upscaling processor 30. The upscaling processor 30 generates the estimated coverage by calculating the ratios between the intensity observations of the i-th intensity observation set 90S and the average intensity observation $\overline{SigCnt_i}$, in some embodiments. FIG. 11 illustrates an example of the estimated coverage 90D for the intensity observation set 90S. The estimated coverage 90D provides an additional output for the upscaling algorithm of FIG. 6. The estimated coverage 90D may be output to another algorithm module (e.g., object tracking module) and used for, e.g., improving the accuracy of object tracking, or for further refinement of the upscaled depth map.

Figure 13:
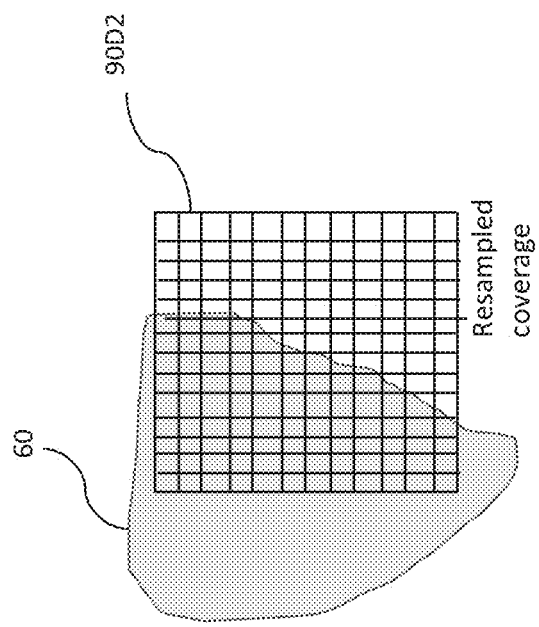
FIG. 13 illustrates resampled coverage for the intensity observation set of FIG. 7, in an embodiment.
Figure 12:
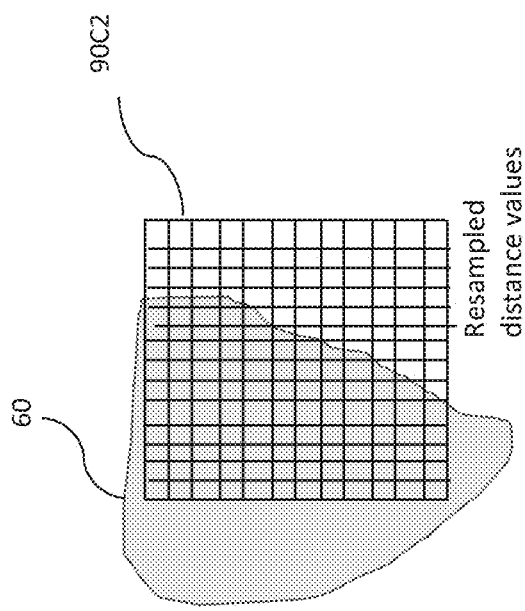
FIG. 12 illustrates resampled distance values for the intensity observation set of FIG. 7, in an embodiment.

FIG. 6 further illustrates an optional Block 224, where the upscaled distance values 90C and/or the estimated coverage 90D may be resampled to generate resampled distance values and resampled coverage with resolutions higher than those of the upscaled distance values 90C and the estimated coverage 90D. FIG. 12 illustrates an example of resampled distance values 90C2, and FIG. 13 illustrates an example of resampled coverage 90D2. The resolution of the resampled distance values 90C2 and the resampled coverage 90D2 illustrated in FIGS. 12 and 13 are for illustration purpose and not limiting.

In some embodiment, the estimated coverage 90D in FIG. 11 is resampled using, e.g., bi-linear or bi-cubic interpolation, to generate the resampled coverage 90D2. Once the resampled coverage 90D2 is generated, it is used in combination with the upscaled distance values 90C in FIG. 10 to generate (e.g., via bi-linear, bi-cubic interpolation, joint-bilateral upsampling, or other suitable method) resampled distance values 90C2, which resampled distance values 90C2 may have a same resolution with the resampled coverage 90D2. For example, the upscaling processor 30 may compare the resampled coverage 90D2 with a pre-determined threshold (e.g., 0.5) to find the edge of the object 60, thus regions in the resampled coverage 90D2 with values smaller than the pre-determined threshold are considered as the background regions, and regions in the resampled coverage 90D2 with values equal to or larger than the pre-determined threshold are considered as the foreground regions. Each (resampled) macropixel in the foreground regions of the resampled distance values 90C2 may be assigned the value of a respective macropixel in the upscaled distance values 90C that is co-located (e.g., at the same location) with the resampled macropixel in 90C2. Each (resampled) macropixel in the background regions of the resampled distance values 90C2 may be assigned the value of the background (e.g., Inf).

The processing shown in FIG. 6 is performed for each SPAD zone, and the upscaled distance values for each SPAD zone are combined (e.g., pieced together) to form an upscaled depth map having a higher resolution than the original depth map 80. In the example illustrated in FIGS. 7-11, the upscaled depth map has a resolution 16 times that of the original depth map 80. With the optional resampling operation, an even higher resolution may be provided by the presently disclosed upscaling algorithm shown in FIG. 6.

Variations to the disclosed upscaling algorithms are possible and are fully intended to be included within the scope of the present disclosure. For example, each SPAD zone may be further divided into a plurality of sub-zones, and each sub-zone may be treated as if it is a SPAD zone using the algorithm described above. This allows for parallel processing of the multiple sub-zones of each SPAD zone. Alternatives for calculating the average intensity observation for each SPAD zone are possible. For example, the intensity observations values of all macropixels in the intensity observation set may be used to calculate the average intensity observation using the inverse-square-root method disclosed above, but with the values of the background macropixels replaced with a fake signal count before the calculation. In particular, background macropixels may be assigned a value equal to the maximum intensity observation of the intensity observation set. In other embodiments, the background macropixels are assigned to a most-frequently occurring value of the intensity observation set. In embodiments where the most-frequently occurring value of the intensity observation set is used, the intensity observations of the intensity observation set may be quantized into a limited number of values first, then the quantized value that occurs the most is used.

The above disclosed upscaling algorithm has many advantages. By using only values of fully covered macropixels to calculate the average intensity observation, the negative effect of the background macropixels and the partially covered macropixels are removed or reduced, and more accurate estimate of the average intensity observation for each intensity observation set is obtained, which in turn produces more accurate upscaled distance values. In addition, by treating the partially covered macropixels differently in the upscaling algorithm, more accurate and robust estimate of the upscaled distance values are obtained for the partially covered macropixels. Furthermore, the estimated coverage provides additional output (e.g., estimated coverage) that can be used by object tracking algorithm to improve tracking accuracy, and may be used to resample the upscaled distance values to obtain an even higher resolution depth map.

Figure 14:
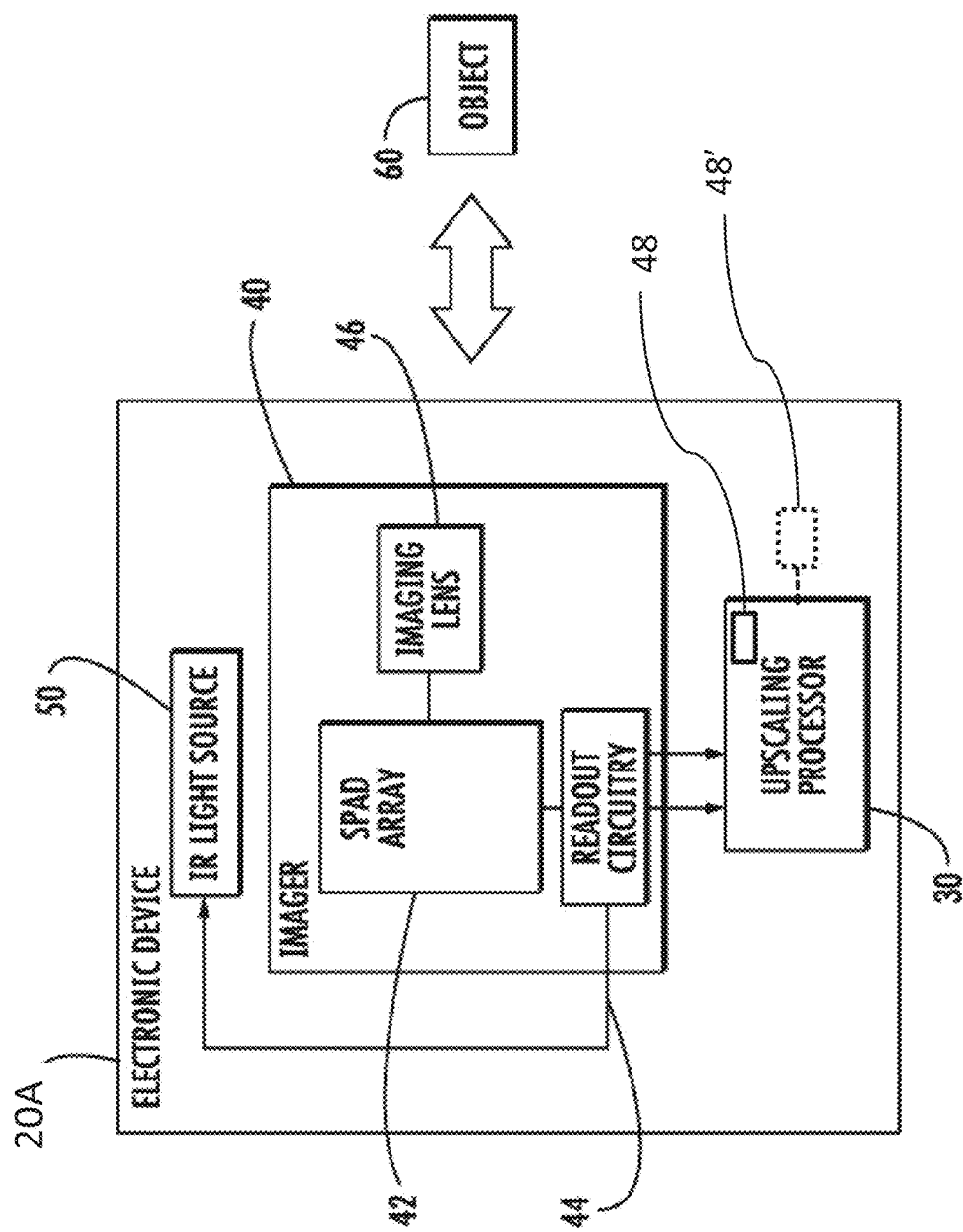
FIG. 14 illustrates a block diagram of an electronic device with an upscaling processor for upscaling a depth map, in an embodiment.

FIG. 14 illustrates a block diagram of an electronic device 20A with an upscaling processor for upscaling a depth map in accordance with an embodiment of the present invention. The electronic device 20A may be used to perform the upscaling algorithms disclosed herein. The electronic device 20A may be the same as or similar to the electronic device 20 of FIG. 1, but with more details illustrated. Similar numerals in FIGS. 1 and 14 refer to the same or similar components, thus details are not repeated. In FIG. 14, the upscaling processor 30 is illustrated to have a memory 48. The memory 48 may be any component or collection of components adapted to store programming and/or instructions for execution by the upscaling processor 30. In some embodiments, the memory 48 includes a non-transitory computer readable medium. Examples of the memory 48 include static random access memory (SRAM), dynamic random access memory (DRAM), read-only memory (ROM), combinations thereof, or the like. The memory 48 is illustrated to be inside the upscaling processor 30 in FIG. 14 as a non-limiting example. In some embodiments, the memory may be located outside of the upscaling processor 30 (see memory 48' illustrated in phantom) and electrically coupled to the upscaling processor 30 for read and/or write access by the upscaling processor 30. These any other variations are fully intended to be included within the scope of the present disclosure.

Figure 15:
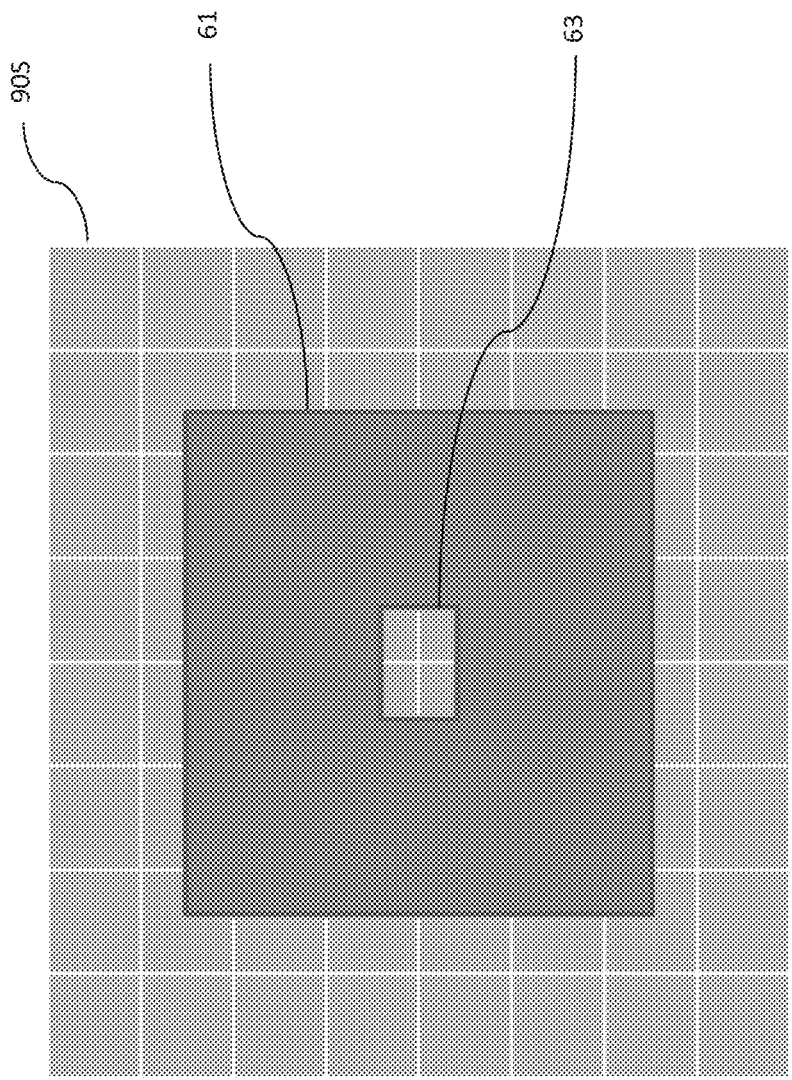
FIG. 15 illustrates a scenario where an object being measured by an SPAD zone has a hole.

FIG. 15 illustrates a scenario where an object 61 (or a portion of the object 61) is being measured by an SPAD zone i that corresponds to the i-th intensity observation set 90S. The object 61 has a hole (e.g., opening) 63 in (e.g., surrounded by) the object 61. The macropixels that are exposed (e.g., partially exposed or fully exposed) by the hole 63 in FIG. 15 tend to have small signal counts, which may lead to large errors in the upscaled distance values if these macropixels are not handled properly. In particular, although it may be advantageous to identify the macropixels exposed by the hole 63 as partially covered macropixels and to form upscaled distance values for these macropixels differently from the fully covered macropixels, the macropixels exposed by the hole 63 may not be identified as partially covered macropixels by the thresholding and/or erosion operations discussed above. For example, due to the reflected signal from portions of the object 61 around the hole 63, the macropixels exposed by the hole 63 may be erroneously identified as fully covered macropixels. An algorithm that handles the above described problem is illustrated in FIG. 16.

Figure 16:
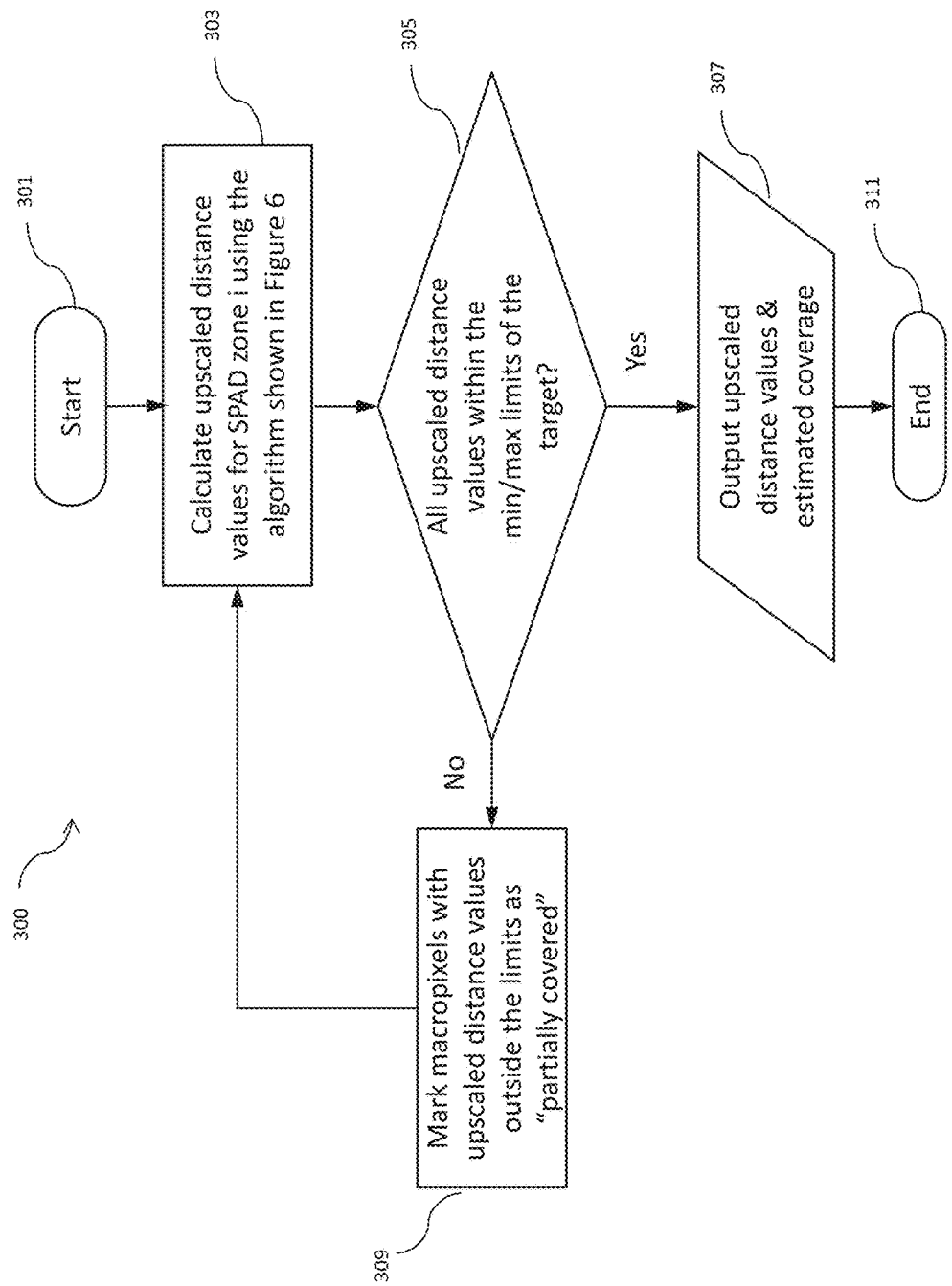
FIG. 16 illustrates a process flow of an embodiment of the upscaling algorithm illustrated in FIG. 3.

Referring now to FIG. 16, FIG. 16 illustrates a process flow 300 of another embodiment upscaling algorithm. The algorithm illustrated in FIG. 16 enhances the algorithm illustrated in FIG. 6 and is able to handle scenarios where the object 61 has one or more holes 63. In some embodiments, the object 61 may comprise one continuous piece of object (see 61 in FIG. 15), or may comprise two or more pieces of discrete (e.g., separate) objects (see 60A and 60B in FIG. 17B). Each of the continuous or discrete objects is referred to as a target herein. Note that each target is disposed between the SPAD array and the background, and thus, is different from the background, in the illustrated embodiment.

Modern ToF devices are able to provide histogram data of the returned signal from the object being measured by the SPAD array 42. The imager 40 processes this histogram data to provide additional information in addition to the range measurement (e.g., distance observation) for each SPAD zone. For example, for each SPAD zone, the additional information available from the imager 40 may include the number of targets (e.g. up to 4 targets per zone) in the SPAD zone; and for each target identified, the imager 40 may provide a median range, a minimum range, a maximum range, and a range sigma (e.g., an estimate of the variation in range due to noise). As an example, consider a case where two targets, one closer to the SPAD array and the other further from the SPAD array, overlap with a same SPAD zone. As a result, the histogram of the ToF data (e.g., distance data at each macropixel) for the SPAD zone may display two peaks located at two locations. By analyzing the histogram, the imager may be able to provide, besides the distance observation for the SPAD zone, additional information such as the number of targets, the minimum/maximum ranges for each target, and the range sigma for each target. These additional information may be used to advantageously improve the upscaling algorithm. The processing illustrated in FIG. 16 is applicable to cases where there is one target in the SPAD zone. Processing for cases where two or more targets are detected in one SPAD zone is discussed hereinafter with reference to FIGS. 17A, 17B, and 17C.

Referring to FIG. 16, for each SPAD zone i, the upscaled distance values for the macropixels in the SPAD zone are calculated at step 303, using the processing shown in FIG. 6 and discussed with reference to FIGS. 7-13. Next, at step 305, the upscaling processor 30 checks if the upscaled distance values of the fully covered macropixels in the SPAD zone are within a limit between the minimum range and the maximum range of the target. If none of the fully covered macropixels has an upscaled distance value outside the limit, the upscaled distance values and the estimated coverage for the SPAD zone, calculated at step 303, are output as the final result. If fully covered macropixels having upscaled distance values outside the limit (e.g., smaller than the minimum range or larger than the maximum range) are found, these macropixels are marked as partially covered macropixels at step 309. Macropixels exposed by the hole 63 (see FIG. 15) and erroneously identified as fully covered macropixels in step 303 tend to have large upscaled distance vales that are outside the limit, thus these macropixels are properly identified as partially covered macropixels at step 309, in the illustrated embodiment. Therefore, the processing step 309 updates the status (e.g., fully covered macropixels, partially covered macropixels, or background macropixels) of the fully covered macropixels.

Next, the processing shown in FIG. 6 for calculating the upscaled distance values and the estimated coverage are performed again with the updated status (performed at step 309) for the macropixels. Particularly, the identification of background macropixels (step 206 of FIG. 6), the identification of the partially covered macropixels (step 208 of FIG. 6), and the identification of the fully covered macropixels in FIG. 6 are omitted, and the updated status determined at the step 309 of FIG. 16 are used to identify the status of the macropixels in the SPAD zone. The newly calculated upscaled distance values for the fully covered macropixel are checked again to see if any upscaled distance value is outside the limit between the minimum range and the maximum range of the target. This process iterates multiple iterations until all upscaled distance values of the fully covered macropixels are within the limits.

When there are two or more targets in the SPAD zone, the signal count in each macropixel may be a mixture of values from each target and/or from partially covered macropixels, and therefore, the signal count is not reliable for calculating the upscaled distance values, unless care is taken to attribute signal counts to their respective target ranges, in some embodiments. A simple technique to form upscaled distance values for a SPAD zone with two or more targets is to assign each macropixel an upscaled distance value that is equal to the range (e.g., distance value) of the closest (or furthest) target. Although this processing will not give a true upscaled distance value, it is relatively safe in that the upscaled distance values will not be grossly incorrect. A more sophisticated processing is discussed below with reference to FIGS. 17A, 17B and 17C.

Figure 17A:
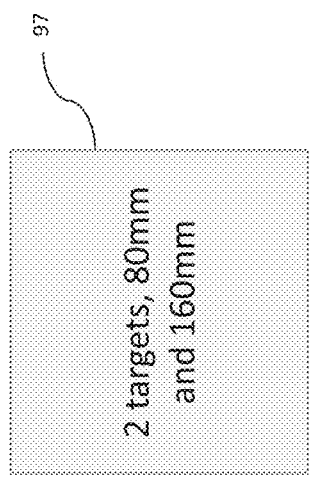
FIGS. 17A, 17B, and 17C illustrate a processing to form upscaled distance values when two or more targets are present in an SPAD zone, in an embodiment.
Figure 17B:
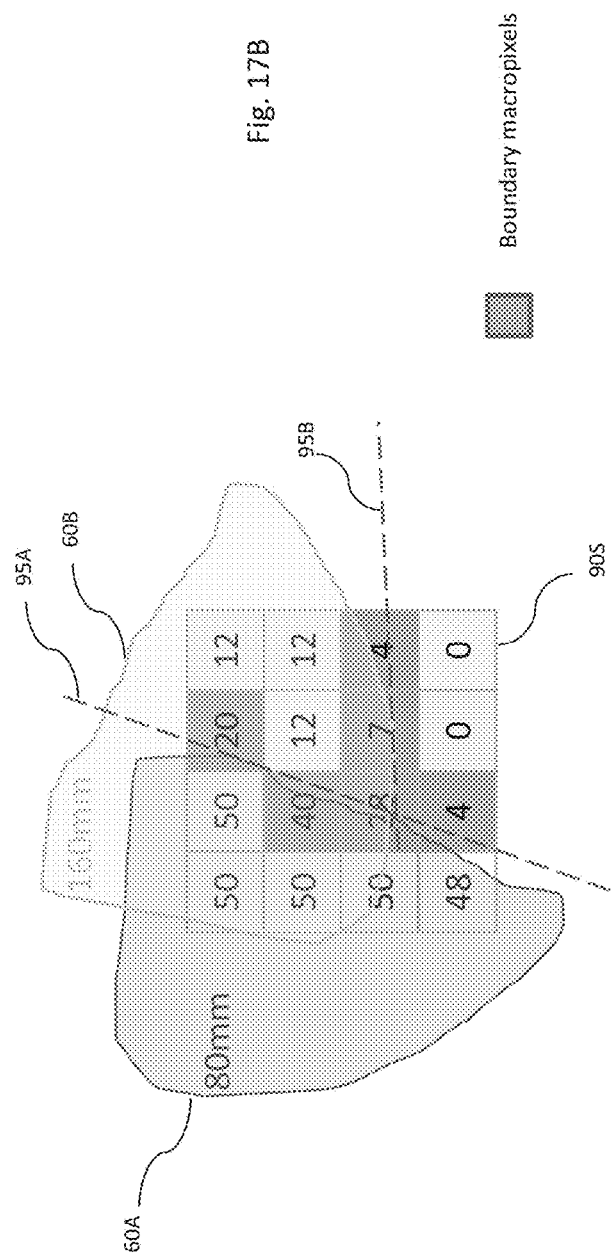
Figure 17C:
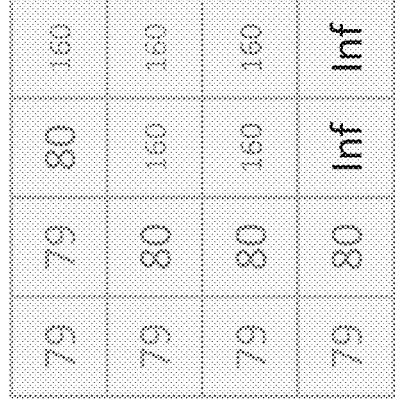

FIGS. 17A, 17B, and 17C illustrate a processing to form upscaled distance values when two or more targets are present in an SPAD zone. In particular, the processing is discussed using an example where two targets 60A and 60B (see FIG. 17B) are within an intensity observation set 90S of an SPAD zone. As illustrated in FIG. 17A, the ToF device produces a histogram data 97 of the range measurement, which indicates that two targets are detected at distance of 80 mm and 160 mm, respectively.

To calculate the upscaled distance values, the upscaling processor 30 first searches the boundaries between targets (e.g., 60A and 60B) in the intensity observation set. The boundaries between targets may be found by a gradient search. For example, the upscaling processor 30 may compare the gradient of the intensity observation values of the macropixels with a pre-determined gradient threshold, and a gradient (or an absolute value of the gradient) larger than the pre-determined gradient threshold indicate a boundary between targets. In the example of FIG. 17B, two boundaries 95A and 95B are identified, and macropixels along the boundaries 95A/95B are labeled as boundary macropixels.

Next, the upscaling processor 30 divides the macropixels in the intensity observation set into a number of groups, using the boundary macropixels as the boundary between different groups, where the number of groups is equal to the number of targets plus one. In the example of FIG. 17B, the number of groups is three, with two groups corresponding to the two targets 60A/60B and one group corresponding to the background. In particular, macropixels in a first group (corresponding to the target 60A) have intensity observations around 50 (e.g., 50 and 48), macropixels in a second group (corresponding to the target 60B) have intensity observations of 12, and macropixels in a third group (corresponding to the background) have intensity observations of 0. Therefore, intensity observations within a same group are associated with a same range (e.g., a distance value for each target, or a distance value for the background).

Next, treating each group as a SPAD zone, the processing discussed above for calculating upscaled distance values, e.g., as illustrated in FIG. 6, is performed for each of the groups, using the range associated with each group as the distance observation for that group. FIG. 17C illustrates the calculated upscaled distance values for each group. For example, the first group of macropixels have upscaled values of 79, the second group of macropixels have upscaled values of 160, and the third group of macropixels have upscaled values of Inf (indicating background). The boundary macropixels, which are identified as partially covered macropixels, may be assigned an upscaled distance value by interpolation or extrapolation from neighboring macropixels, or may be assigned an upscaled distance value equal to a nearest target range value. The example of FIG. 17C uses the nearest target range values for the boundary macropixels.

Figure 18:
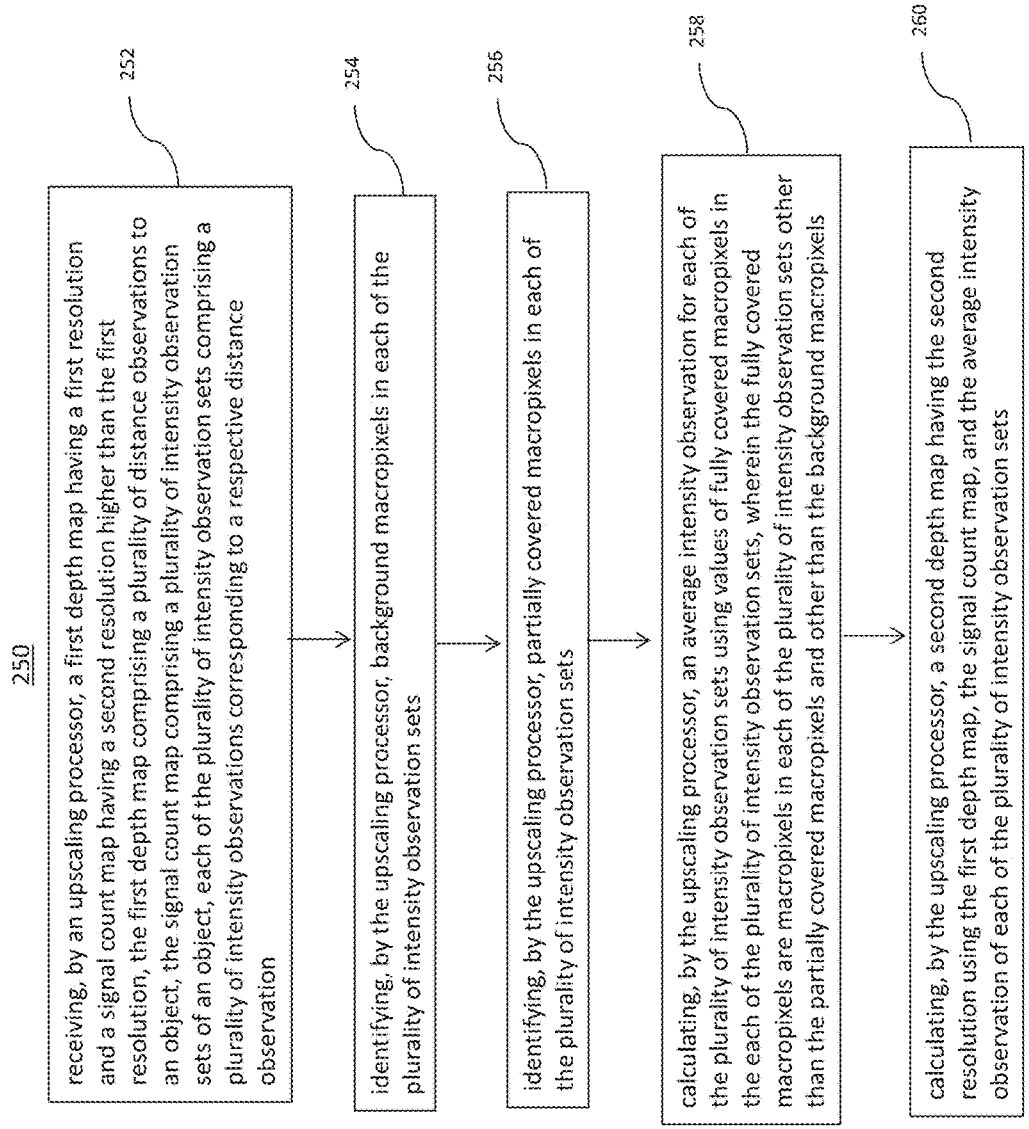
FIG. 18 is a flowchart of a method for upscaling depth maps produced by a single-photon avalanche diode (SPAD) array using an upscaling processor, in some embodiments.

Referring now to the flowchart 250 illustrated in FIG. 18, a method for upscaling depth maps produced by a single-photon avalanche diode (SPAD) array using an upscaling processor will be discussed. In Block 252, an upscaling processor receives a first depth map having a first resolution and a signal count map having a second resolution higher than the first resolution, the first depth map comprising a plurality of distance observations to an object, the signal count map comprising a plurality of intensity observation sets of the object, each of the intensity observation sets comprising a plurality of intensity observations corresponding to a respective distance observation. In Block 254, the upscaling processor identifies background macropixels in each of the intensity observation sets. In Block 256, the upscaling processor identifies partially covered macropixels in each of the intensity observation sets. In Block 258, the upscaling processor calculates an average intensity observation for each of the intensity observation sets using values of fully covered macropixels in the each of the intensity observation sets, wherein the fully covered macropixels are macropixels in each of the intensity observation sets other than the partially covered macropixels and other than the background macropixels. In Block 260, the upscaling processor calculates a second depth map having the second resolution using the first depth map, the signal count map, and the average intensity observation of each of the intensity observation sets.

Example embodiments of the present invention are summarized here. Other embodiments can also be understood from the entirety of the specification and the claims filed herein.

EXAMPLE 1

In an embodiment, a method for operating an electronic device that includes an imager and an upscaling processor coupled to the imager includes: generating, by the imager, a first depth map and a signal count map, the first depth map having a first resolution and comprising a plurality of distance observations to an object, the signal count map having a second resolution higher than the first resolution and comprising a plurality of intensity observation sets of the object, each of the plurality of intensity observation sets comprising a plurality of intensity observations and corresponding to a respective distance observation of the plurality of distance observations in the first depth map; and upscaling, by the upscaling processor, each of the plurality of distance observations of the first depth map into a plurality of upscaled distance observations, to form a second depth map with the second resolution, wherein the upscaling comprises: identifying fully covered macropixels in a first intensity observation set of the plurality of intensity observation sets; calculating an average intensity observation using values of the fully covered macropixels in the first intensity observation set; and calculating a plurality of upscaling factors for the fully covered macropixels in the first intensity observation set using the average intensity observation.

EXAMPLE 2

The method of example 1, wherein the upscaling further comprises: multiplying a first distance observation of the plurality of distance observations with the plurality of upscaling factors to form upscaled distance observations for the fully covered macropixels in the first intensity observation set, wherein the first distance observation corresponds to the first intensity observation set.

EXAMPLE 3

The method of example 1, wherein identifying fully covered macropixels comprises performing a thresholding operation to the first intensity observation set to identify background macropixels of the first intensity observation set; and identifying partially covered macropixels of the first intensity observation set, wherein the partially covered macropixels are macropixels immediately adjacent to the background macropixels, wherein macropixels of the first intensity observation set other than the background macropixels and other than the partially covered macropixels are identified as the fully covered macropixels.

EXAMPLE 4

The method of example 3, wherein performing the thresholding operation comprises comparing intensity observations of the first intensity observation set with a pre-determined threshold.

EXAMPLE 5

The method of example 3, wherein performing the thresholding operation comprises detecting an abrupt change between adjacent intensity observations of the first intensity observation set.

EXAMPLE 6

The method of example 5, wherein detecting the abrupt change comprises comparing a gradient of the intensity observations of the first intensity observation set with a pre-determined threshold.

EXAMPLE 7

The method of example 1, wherein the average intensity observation for the first intensity observation set, denoted by $\overline{SigCnt}$, is calculated by $$\sqrt{\overline{SigCnt}} = \frac{N}{\sum_{j=1...N} \frac{1}{\sqrt{SigCnt_j}}}$$

where N is the number of the fully covered macropixels in the first intensity observation set, and $SigCnt_j$ is the intensity observation of the j-th fully covered macropixel in the first intensity observation set.

EXAMPLE 8

The method of example 7, wherein calculating the plurality of upscaling factors comprises calculating the plurality of upscaling factors by $$f(\overline{SigCnt}, SigCnt_l) = \sqrt{\frac{\overline{SigCnt}}{SigCnt_l}}$$

where l=1, 2, ..., N, $SigCnt_l$ is the intensity observation of the l-th fully covered macropixel in the first observation set, and $f(\overline{SigCnt}, SigCnt_l)$ is the l-th upscaling factor of the plurality of upscaling factors.

EXAMPLE 9

The method of example 1, wherein the upscaling further comprises: calculating an upscaled distance value for each of the fully covered macropixels of the first intensity observation set; and calculating upscaled distance values for partially covered macropixels of the first intensity observation set.

EXAMPLE 10

The method of example 9, wherein calculating upscaled distance values for the partially covered macropixels comprises: locating a neighboring fully covered macropixel for each of the partially covered macropixels; and assigning the upscaled distance value of the neighboring fully covered macropixel as the upscaled distance value for the each of the partially covered macropixels.

EXAMPLE 11

The method of example 9, wherein calculating upscaled distance values for the partially covered macropixels comprises: assigning a distance observation corresponding to the first intensity observation set as the upscaled distance value for each of the partially covered macropixels in the first intensity observation set.

EXAMPLE 12

The method of example 1, wherein the upscaling further comprises calculating an estimated coverage for the first intensity observation set.

EXAMPLE 13

The method of example 12, wherein the upscaling further comprises: resampling the estimated coverage to produce a resampled coverage having a third resolution higher than the second resolution; and resampling the second depth map to produce a third depth map having the third resolution using the resampled coverage.

EXAMPLE 14

A method of upscaling depth maps produced by a single-photon avalanche diode (SPAD) array using an upscaling processor includes: receiving, by the upscaling processor, a first depth map having a first resolution and a signal count map having a second resolution higher than the first resolution, the first depth map comprising a plurality of distance observations to an object, the signal count map comprising a plurality of intensity observation sets of the object, each of the plurality of intensity observation sets comprising a plurality of intensity observations corresponding to a respective distance observation of the plurality of distance observations; identifying, by the upscaling processor, background macropixels in each of the plurality of intensity observation sets; identifying, by the upscaling processor, partially covered macropixels in each of the plurality of intensity observation sets; calculating, by the upscaling processor, an average intensity observation for each of the plurality of intensity observation sets using values of fully covered macropixels in the each of the plurality of intensity observation sets, wherein the fully covered macropixels are macropixels in each of the plurality of intensity observation sets other than the partially covered macropixels and other than the background macropixels; and calculating, by the upscaling processor, a second depth map having the second resolution using the first depth map, the signal count map, and the average intensity observation of each of the plurality of intensity observation sets.

EXAMPLE 15

The method of example 14, wherein the average intensity observation for an i-th intensity observation set, denoted by $\overline{SigCnt_i}$, is calculated by $$\sqrt{\overline{SigCnt_i}} = \frac{N}{\sum_{j=1...N} \frac{1}{\sqrt{SigCnt_{i,j}}}}$$

where i=1, 2, . . . , M, the signal count map has M intensity observation sets, the i-th intensity observation set has N fully covered macropixels, and $SigCnt_{i,j}$ is the value of the j-th fully covered macropixel in the i-th intensity observation set.

EXAMPLE 16

The method of example 14, wherein calculating, by the upscaling processor, a second depth map comprises, for each of the plurality of intensity observation sets: calculating a plurality of upscaling factors for the fully covered macropixels; and calculating upscaled distance values for the fully covered macropixels by multiplying the plurality of upscaling factors with the respective distance observation.

EXAMPLE 17

The method of example 16, wherein for a j-th fully covered macropixel in an i-th intensity observation set having a value $SigCnt_{i,j}$, a respective upscaling factor is calculated by $$\sqrt{\frac{\overline{SigCnt_i}}{SigCnt_{i,j}}},$$

where $\overline{SigCnt_i}$ is the average intensity observation for the i-th intensity observation set.

EXAMPLE 18

The method of example 16, wherein calculating, by the upscaling processor, a second depth map further comprises, for each of the plurality of intensity observation sets: calculating an upscaled distance value for each of the partially covered macropixels.

EXAMPLE 19

The method of example 16, wherein calculating, by the upscaling processor, a second depth map further comprises, for each of the plurality of intensity observation sets: determining, by the upscaling processor, a number of targets using a histogram data from the SPAD array after calculating the second depth map; and updating, by the upscaling processor, the second depth map in response to detecting that there is one target in the each of the plurality of intensity observation sets.

EXAMPLE 20

The method of example 19, wherein updating, by the upscaling processor, the second depth map comprises: updating, by the upscaling processor, status of the fully covered macropixels with upscaled distance values outside a limit as partially covered macropixels, wherein the limit is between a minimum range of the target and a maximum range of the target; calculating, by the upscaling processor, an updated average intensity observation for the each of the plurality of intensity observation sets using intensity observation values of the fully covered macropixels thereof after updating the status of the fully covered macropixels; and recalculating, by the upscaling processor, the upscaled distance values for the fully covered macropixels using a respective distance observation, the intensity observation values, and the updated average intensity observation.

EXAMPLE 21

An electronic device comprising: an imager comprising a single-photon avalanche diode (SPAD) array, wherein the imager is configured to generate a first depth map having a first resolution, wherein the first depth map has a plurality of distance observations to an object, and generate a signal count map having a second resolution greater than the first resolution, wherein the signal count map has a plurality of intensity observation sets of the object, wherein each of the plurality of intensity observation sets has a plurality of intensity observations corresponding to a respective distance observation of the plurality of distance observations; an upscaling processor coupled to the imager; and a non-transitory computer readable storage medium storing programming for execution by the upscaling processors, the programming including instructions to: identify, by the upscaling processor, fully covered macropixels in each of the plurality of intensity observation sets; calculate, by the upscaling processor, an average intensity observation for each of the plurality of intensity observation sets using values of the fully covered macropixels in the each of the plurality of intensity observation sets; and calculate, by the upscaling processor, a second depth map having the second resolution using the first depth map, the average intensity observation of each of the plurality of intensity observation sets, and the signal count map.

EXAMPLE 22

The electronic device of example 21, wherein the upscaling processor is configured to calculate the second depth map by calculating an upscaling factor for each of the fully covered macropixels using a value of the each of the fully covered macropixels and a respective average intensity observation, and calculating an upscaled distance value for the each of the fully covered macropixels using the upscaling factor and a respective distance observation.

EXAMPLE 23

The electronic device of example 21, wherein the upscaling processor is configured to calculate the second depth That which is claimed is:

1. A method for operating an electronic device, the electronic device comprising an imager and an upscaling processor coupled to the imager, the method comprising:
generating, by the imager, a first depth map and a signal count map, the first depth map having a first resolution and comprising a plurality of distance observations to an object, the signal count map having a second resolution higher than the first resolution and comprising a plurality of intensity observation sets of the object, each of the plurality of intensity observation sets comprising a plurality of intensity observations, wherein a number of intensity observation sets in the signal count map is equal to a number of distance observations in the first depth map, wherein each of the plurality of intensity observation sets has a corresponding distance observation such that each of the plurality of intensity observation sets and the corresponding distance observation comprise different information regarding a same region of the object, wherein each of the plurality of distance observations comprises information regarding a distance between the imager and a region of the object, and the plurality of intensity observations in a corresponding intensity observation set comprise information regarding reflected intensities for the region of the object; and
upscaling, by the upscaling processor, each of the plurality of distance observations of the first depth map into a plurality of upscaled distance observations, to form a second depth map with the second resolution, wherein the upscaling comprises:
identifying fully covered macropixels in a first intensity observation set of the plurality of intensity observation sets;
calculating an average intensity observation using values of the fully covered macropixels in the first intensity observation set;
calculating a plurality of upscaling factors for the fully covered macropixels in the first intensity observation set using the average intensity observation; and
multiplying a first distance observation of the plurality of distance observations with the plurality of upscaling factors to form upscaled distance observations for the fully covered macropixels in the first intensity observation set, wherein the first distance observation corresponds to the first intensity observation set.

2. The method of claim 1, wherein identifying fully covered macropixels comprises:
performing a thresholding operation to the first intensity observation set to identify background macropixels of the first intensity observation set; and
identifying partially covered macropixels of the first intensity observation set, wherein the partially covered macropixels are macropixels immediately adjacent to the background macropixels, wherein macropixels of the first intensity observation set other than the background macropixels and other than the partially covered macropixels are identified as the fully covered macropixels.

3. The method of claim 2, wherein performing the thresholding operation comprises comparing intensity observations of the first intensity observation set with a pre-determined threshold.

4. The method of claim 2, wherein performing the thresholding operation comprises detecting an abrupt change between adjacent intensity observations of the first intensity observation set.

5. The method of claim 4, wherein detecting the abrupt change comprises comparing a gradient of the intensity observations of the first intensity observation set with a pre-determined threshold.

6. The method of claim 1, wherein the average intensity observation for the first intensity observation set, denoted by $\overline{SigCnt}$, is calculated by $$\sqrt{\overline{SigCnt}} = \frac{N}{\sum_{j=1...N} \frac{1}{\sqrt{SigCnt_j}}}$$

where N is the number of the fully covered macropixels in the first intensity observation set, and $SigCnt_j$ is the intensity observation of the j-th fully covered macropixel in the first intensity observation set.

7. The method of claim 6, wherein calculating the plurality of upscaling factors comprises calculating the plurality of upscaling factors by $$f(\overline{SigCnt}, SigCnt_l) = \sqrt{\frac{\overline{SigCnt}}{SigCnt_l}}$$

where l=1, 2, ..., N, $SigCnt_l$ is the intensity observation of the l-th fully covered macropixel in the first observation set, and $f(\overline{SigCnt}, SigCnt_l)$ is the l-th upscaling factor of the plurality of upscaling factors.

8. The method of claim 1, wherein the upscaling further comprises:
calculating an upscaled distance value for each of the fully covered macropixels of the first intensity observation set; and
calculating upscaled distance values for partially covered macropixels of the first intensity observation set.

9. The method of claim 8, wherein calculating upscaled distance values for the partially covered macropixels comprises:
locating a neighboring fully covered macropixel for each of the partially covered macropixels; and
assigning the upscaled distance value of the neighboring fully covered macropixel as the upscaled distance value for the each of the partially covered macropixels.

10. The method of claim 8, wherein calculating upscaled distance values for the partially covered macropixels comprises:
assigning a distance observation corresponding to the first intensity observation set as the upscaled distance value for each of the partially covered macropixels in the first intensity observation set.

11. The method of claim 1, wherein the upscaling further comprises calculating an estimated coverage for the first intensity observation set.

12. The method of claim 11, wherein the upscaling further comprises:
resampling the estimated coverage to produce a resampled coverage having a third resolution higher than the second resolution; and
resampling the second depth map to produce a third depth map having the third resolution using the resampled coverage.

13. A method of upscaling depth maps produced by a single-photon avalanche diode (SPAD) array using an upscaling processor, the method comprising:
receiving, by the upscaling processor, a first depth map having a first resolution and a signal count map having a second resolution higher than the first resolution, the first depth map comprising a plurality of distance observations to an object, the signal count map comprising a plurality of intensity observation sets of the object, each of the plurality of intensity observation sets and a respective distance observation providing different information for a same region of an object measured by the SPAD array, each of the plurality of intensity observation sets comprising a plurality of intensity observations measuring reflected intensities for a region of the object, each respective distance observation measuring a distance between the SPAD array and the region of the object;
identifying, by the upscaling processor, background macropixels in each of the plurality of intensity observation sets;
identifying, by the upscaling processor, partially covered macropixels in each of the plurality of intensity observation sets;
calculating, by the upscaling processor, an average intensity observation for each of the plurality of intensity observation sets using values of fully covered macropixels in the each of the plurality of intensity observation sets, wherein the fully covered macropixels are macropixels in each of the plurality of intensity observation sets other than the partially covered macropixels and other than the background macropixels; and
calculating, by the upscaling processor, a second depth map having the second resolution using the first depth map, the signal count map, and the average intensity observation of each of the plurality of intensity observation sets, wherein calculating, by the upscaling processor, the second depth map comprises, for each of the plurality of intensity observation sets:
calculating a plurality of upscaling factors for the fully covered macropixels; and
calculating upscaled distance values for the fully covered macropixels by multiplying the plurality of upscaling factors with the respective distance observation.

14. The method of claim 13, wherein the average intensity observation for an i-th intensity observation set, denoted by $\overline{SigCnt_i}$, is calculated by $$\sqrt{\overline{SigCnt_i}} = \frac{N}{\sum_{j=1...N} \frac{1}{\sqrt{SigCnt_{i,j}}}}$$

where i=1, 2, . . . , M, the signal count map has M intensity observation sets, the i-th intensity observation set has N fully covered macropixels, and $SigCnt_{i,j}$ is the value of the j-th fully covered macropixel in the i-th intensity observation set.

15. The method of claim 13, wherein for a j-th fully covered macropixel in an i-th intensity observation set having a value $SigCnt_{i,j}$, a respective upscaling factor is calculated by $$\sqrt{\frac{\overline{SigCnt_i}}{SigCnt_{i,j}}},$$

where $\overline{SigCnt_i}$ is the average intensity observation for the i-th intensity observation set.

16. The method of claim 13, wherein calculating, by the upscaling processor, a second depth map further comprises, for each of the plurality of intensity observation sets:
calculating an upscaled distance value for each of the partially covered macropixels.

17. The method of claim 13, wherein calculating, by the upscaling processor, a second depth map further comprises, for each of the plurality of intensity observation sets:
determining, by the upscaling processor, a number of targets using a histogram data from the SPAD array after calculating the second depth map; and
updating, by the upscaling processor, the second depth map in response to detecting that there is one target in the each of the plurality of intensity observation sets.

18. The method of claim 17, wherein updating, by the upscaling processor, the second depth map comprises:
updating, by the upscaling processor, status of the fully covered macropixels with upscaled distance values outside a limit as partially covered macropixels, wherein the limit is between a minimum range of the target and a maximum range of the target;
calculating, by the upscaling processor, an updated average intensity observation for the each of the plurality of intensity observation sets using intensity observation values of the fully covered macropixels thereof after updating the status of the fully covered macropixels; and
recalculating, by the upscaling processor, the upscaled distance values for the fully covered macropixels using a respective distance observation, the intensity observation values, and the updated average intensity observation.

19. An electronic device comprising:
an imager comprising a single-photon avalanche diode (SPAD) array, wherein the imager is configured to
generate a first depth map having a first resolution, wherein the first depth map has a first number of distance observations to an object, and
generate a signal count map having a second resolution greater than the first resolution, wherein the signal count map has the first number of intensity observation sets of the object, wherein each of the first number of intensity observation sets has a plurality of intensity observations, wherein each of the plurality of intensity observation set and a corresponding distance observation provide measurements of different properties for a same region of the object;
an upscaling processor coupled to the imager; and a non-transitory computer readable storage medium storing programming for execution by the upscaling processors, the programming including instructions to:
   identify, by the upscaling processor, fully covered macropixels in each of the first number of intensity observation sets;
   calculate, by the upscaling processor, an average intensity observation for each of the first number of intensity observation sets using values of the fully covered macropixels in the each of the first number of intensity observation sets; and
   calculate, by the upscaling processor, a second depth map having the second resolution using the first depth map, the average intensity observation of each of the first number of intensity observation sets, and the signal count map,
wherein the upscaling processor is configured to calculate the second depth map by:
   calculating an upscaling factor for each of the fully covered macropixels using a value of the each of the fully covered macropixels and a respective average intensity observation, and
   calculating an upscaled distance value for the each of the fully covered macropixels using the upscaling factor and a respective distance observation.

20. The electronic device of claim 19, wherein the upscaling processor is configured to calculate the second depth map by:
   identifying partially covered macropixels in each of the plurality of intensity observation sets; and
   calculating an upscaled distance value for each of the partially covered macropixels.

* * * * *